US009368521B2

(12) United States Patent
Moriwaki

(10) Patent No.: US 9,368,521 B2
(45) Date of Patent: Jun. 14, 2016

(54) TFT SUBSTRATE

(71) Applicant: Sharp Kabushiki Kaisha, Osaka-shi, Osaka (JP)

(72) Inventor: Hiroyuki Moriwaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/647,875

(22) PCT Filed: Nov. 22, 2013

(86) PCT No.: PCT/JP2013/081475
§ 371 (c)(1),
(2) Date: May 28, 2015

(87) PCT Pub. No.: WO2014/084130
PCT Pub. Date: Jun. 5, 2014

(65) Prior Publication Data

US 2015/0311227 A1 Oct. 29, 2015

(30) Foreign Application Priority Data

Nov. 30, 2012 (JP) ................................ 2012-262254

(51) Int. Cl.
*H01L 29/10* (2006.01)
*H01L 27/12* (2006.01)
(Continued)

(52) U.S. Cl.
CPC ........ *H01L 27/124* (2013.01); *G02F 1/134363* (2013.01); *G02F 1/136227* (2013.01); *H01L 27/1225* (2013.01); *H01L 27/1248* (2013.01);
(Continued)

(58) Field of Classification Search
None
See application file for complete search history.

(56) References Cited

U.S. PATENT DOCUMENTS 5,920,082 A 7/1999 Kitazawa et al.
5,986,723 A * 11/1999 Nakamura ............ G02F 1/1368 349/140

(Continued)

FOREIGN PATENT DOCUMENTS

JP 03-132626 A 6/1991
JP 09-105952 A 4/1997

(Continued)

OTHER PUBLICATIONS

Official Communication issued in International Patent Application No. PCT/JP2013/081475, mailed on Feb. 4, 2014.

*Primary Examiner* — Benjamin Sandvik
*Assistant Examiner* — Herve Assouman
(74) *Attorney, Agent, or Firm* — Keating & Bennett, LLP

(57) ABSTRACT

A TFT substrate (100) includes a gate line (2) and a source line (4), a TFT (6), a transparent pixel electrode (30) electrically coupled with the TFT, a transparent electrically-conductive layer (34) including a transparent connecting portion (34A) connected with the drain electrode (15) of the TFT and the transparent pixel electrode, and a transparent insulating layer (28) provided between the transparent pixel electrode and the transparent electrically-conductive layer. The transparent connecting portion (34A) includes a first connecting portion (C1) which is a portion connected with the drain electrode and a second connecting portion (C2) which is a portion connected with the transparent pixel electrode. At least part of the second connecting portion (C2) is present in a region enclosed by the gate line and the source line. In the second connecting portion, a portion ranging from the transparent connecting portion to the transparent pixel electrode is configured to allow transmission of light.

13 Claims, 14 Drawing Sheets

(51) Int. Cl.

| | |
|---|---|
| ***G02F 1/1343*** | (2006.01) |
| ***G02F 1/1362*** | (2006.01) |
| ***H01L 29/786*** | (2006.01) |
| *H01L 27/32* | (2006.01) |
| *G02F 1/167* | (2006.01) |

(52) U.S. Cl.
CPC ........ *H01L 27/1255* (2013.01); *H01L 29/7869* (2013.01); *G02F 2001/134372* (2013.01); *G02F 2001/1676* (2013.01); *H01L 27/3276* (2013.01)

(56) References Cited

U.S. PATENT DOCUMENTS

| | | | | |
|---|---|---|---|---|
| 6,195,138 | B1 | 2/2001 | Shimada et al. | |
| 6,335,772 | B1 * | 1/2002 | Sato .................. | G02F 1/136209 349/110 |
| 6,654,076 | B2 * | 11/2003 | Ha .................... | G02F 1/133555 349/110 |
| 2002/0101152 | A1 * | 8/2002 | Kimura ............... | H01L 51/5271 313/505 |
| 2003/0020853 | A1 * | 1/2003 | Park .................. | G02F 1/133555 349/113 |
| 2003/0122990 | A1 * | 7/2003 | Kim .................. | G02F 1/136213 349/43 |
| 2005/0269941 | A1 * | 12/2005 | Kim .................... | H01L 27/3244 313/503 |
| 2006/0028598 | A1 * | 2/2006 | Lee ..................... | G02F 1/13394 349/107 |
| 2008/0018815 | A1 * | 1/2008 | Choi ................. | G02F 1/136286 349/37 |
| 2008/0024416 | A1 * | 1/2008 | Onogi ............... | G02F 1/134363 345/92 |
| 2008/0316385 | A1 * | 12/2008 | Matsumura ....... | G02F 1/134363 349/39 |
| 2011/0111543 | A1 | 5/2011 | Ono | |
| 2011/0122330 | A1 | 5/2011 | Tae et al. | |
| 2012/0138922 | A1 | 6/2012 | Yamazaki et al. | |

FOREIGN PATENT DOCUMENTS

| | | | |
|---|---|---|---|
| JP | 11-119261 | A | 4/1999 |
| JP | 2008-032899 | A | 2/2008 |
| JP | 2011-100041 | A | 5/2011 |
| JP | 2011-113081 | A | 6/2011 |
| JP | 2012-134475 | A | 7/2012 |

* cited by examiner (a)

(b)

(c)

(a)

(b)

(a)

(b)

(a)

(b)

(a)

(b)

TFT SUBSTRATE

TECHNICAL FIELD

The present invention relates to a TFT substrate, and particularly to a TFT substrate suitably used for display devices.

BACKGROUND ART

Active matrix type liquid crystal display devices generally include a substrate having thin film transistors (hereinafter, also referred to as "TFT") which are provided to respective ones of the pixels and serve as switching elements (hereinafter, referred to as "TFT substrate"), a counter substrate having a color filter and other components, a liquid crystal layer provided between the TFT substrate and the counter substrate, and a pair of electrodes for applying a voltage across the liquid crystal layer.

For active matrix type liquid crystal display devices, various operation modes corresponding to their uses have been proposed and adopted. Examples of the operation mode include TN (Twisted Nematic) mode, VA (Vertical Alignment) mode, IPS (In-Plane-Switching) mode, and FFS (Fringe Field Switching) mode.

Among these modes, the TN mode and the VA mode are vertical electric field modes in which an electric field is applied to liquid crystal molecules by a pair of electrodes that are arranged so as to sandwich the liquid crystal layer. The IPS mode and the FFS mode are transverse electric field modes in which a pair of electrodes are provided on one substrate, and an electric field is applied to liquid crystal molecules in a direction parallel to a surface of the substrate (transverse direction). In the transverse electric field modes, the liquid crystal molecules do not rise from the substrate, and therefore, there is an advantage that a wide viewing angle can be realized as compared with the vertical electric field modes.

FFS mode liquid crystal display devices are disclosed in, for example, Patent Document 1 and other documents. In TFT substrates used in these devices, a common electrode and a pixel electrode are provided above TFTs with an insulating film provided therebetween. Of these electrodes, typically, one provided on the liquid crystal layer side (e.g., pixel electrode) has an opening in the form of a slit. Thus, an electric field produced is represented by a line of electric force extending from the pixel electrode and passing through the liquid crystal layer and then through the slit opening before reaching the common electrode. This electric field includes a component transverse to the liquid crystal layer, and therefore, the liquid crystal molecules aligned in the horizontal direction can be rotated in a plane.

Meanwhile, forming the active layer of the TFT using an oxide semiconductor instead of a silicon semiconductor has been proposed. Such a TFT is referred to as "oxide semiconductor TFT". For example, Patent Document 2 discloses an active matrix type liquid crystal display device in which oxide semiconductor TFTs are used as the switching elements.

The oxide semiconductor has a higher mobility than amorphous silicon. Therefore, oxide semiconductor TFTs are capable of higher speed operation than amorphous silicon TFTs. Also, oxide semiconductor films can advantageously be formed through a simple and convenient process as compared with polycrystalline silicon films.

The size of the oxide semiconductor TFT is small. Thus, when this is used in a display device, the pixel aperture ratio can be improved as compared with a case where a conventional TFT is used. Therefore, brighter display can be achieved. Alternatively, the brightness of the backlight may be reduced, and the power consumption can be reduced.

Further, since the off-leak current of the oxide semiconductor TFT is very small, a single gate TFT can be employed rather than a conventional double-gate configuration, whereby size reduction can be realized. Also, the retained voltage in an OFF period is appropriately maintained for a relatively long period of time. Thus, it is possible to employ an operation mode in which the operation frequency is decreased according to the conditions of use, and the power consumption can be reduced without causing display errors, such as flicker.

CITATION LIST

Patent Literature

Patent Document 1: Japanese Laid-Open Patent Publication No. 2008-32899

Patent Document 2: Japanese Laid-Open Patent Publication No. 2012-134475

Patent Document 3: Japanese Laid-Open Patent Publication No. 2011-100041

Patent Document 4: Japanese Laid-Open Patent Publication No. 2011-113081

SUMMARY OF INVENTION

Technical Problem

However, due to the spread of the use and the required specifications of liquid crystal display devices, the TFT substrate has been demanded to have further increased resolution and transmittance.

In small-size, high-resolution display devices for use in mobile devices such as smartphones, it is difficult to further decrease the line width in wiring patterns due to the process rules (or design rules). Therefore, in smaller pixels, decrease of the pixel aperture ratio cannot be avoided, so that increase in transmittance is difficult to achieve. One of the problems in size reduction and increase in resolution in display devices resides in how the pixel aperture ratio can be increased.

As described above, there has been a problem of further increasing the pixel aperture ratio in the TFT substrate. The present invention was conceived in view of the above problems. One of the major objects of the present invention is to provide a TFT substrate with an improved aperture ratio which can be suitably used in small-size, high-resolution display devices.

Solution to Problem

A TFT substrate of an embodiment of the present invention includes: a substrate; a gate line and a source line which are provided on the substrate; a TFT including a gate electrode connected with the gate line, a source electrode connected with the source line, a drain electrode, and a semiconductor layer; a transparent pixel electrode electrically coupled with the drain electrode of the TFT; a transparent electrically-conductive layer including a transparent connecting portion connected with the drain electrode of the TFT and the transparent pixel electrode, the transparent connecting portion including a first connecting portion which is a portion connected with the drain electrode and a second connecting portion which is provided at a different position from the first connecting portion and which is a portion connected with the transparent pixel electrode; and a transparent insulating layer provided between the transparent pixel electrode and the transparent electrically-conductive layer, the transparent insulating layer having an opening at a position corresponding to the second connecting portion, wherein at least part of the second connecting portion and at least part of the opening are present in a region enclosed by the gate line and the source line, and in the second connecting portion, at least a portion ranging from the transparent connecting portion to the transparent pixel electrode is configured to allow transmission of light.

In one embodiment, the transparent connecting portion is arranged in the form of an island, the first connecting portion is provided above the gate line, and at least part of the second connecting portion is provided at a position which does not overlap the gate line in the vicinity of the first connecting portion.

In one embodiment, the transparent pixel electrode and the first connecting portion do not at least partially overlap each other when seen in a direction normal to the substrate.

In one embodiment, the transparent pixel electrode has a rectangular planar shape, and one of four sides of the transparent pixel electrode which is near to the TFT is positioned on a pixel region side relative to the gate line.

In one embodiment, the TFT substrate further includes a gate insulating layer provided on the gate electrode, wherein the source electrode, the drain electrode, and the semiconductor layer are provided on the gate insulating layer.

In one embodiment, the TFT substrate further includes a flattening layer which is arranged so as to cover the TFT, wherein the first connecting portion of the transparent connecting portion is provided in an opening provided in the flattening layer, and the second connecting portion of the transparent connecting portion is provided on the flattening layer.

In one embodiment, the flattening layer has a thickness of not less than 1 μm and not more than 3 μm, and the transparent insulating layer has a thickness of not less than 10 nm and not more than 500 nm.

In one embodiment, the flattening layer is made of a photosensitive organic insulative material, and the transparent insulating layer is made of an inorganic insulative material.

In one embodiment, a size of an opening provided in the flattening layer is not less than 3 μm and not more than 10 μm, a size of an opening provided in the insulating layer is not less than 2 μm and not more than 9 μm, and the former is greater than the latter.

In one embodiment, the transparent insulating layer further includes a storage capacitance forming portion which is insulated from the transparent connecting portion, and the storage capacitance forming portion forms a storage capacitance between the storage capacitance forming portion and the transparent pixel electrode via the transparent insulating layer.

In one embodiment, the TFT substrate further includes: a common electrode which is arranged so as to oppose the transparent pixel electrode; and an insulating layer provided between the common electrode and the transparent pixel electrode, wherein the common electrode is electrically insulated from the transparent pixel electrode and the drain electrode, at least one of the transparent pixel electrode and the common electrode has a plurality of slits or a plurality of elongated electrode portions, and the common electrode and the transparent pixel electrode are configured such that an oblique electric field is produced between the common electrode and the transparent pixel electrode.

In one embodiment, the common electrode has a plurality of slits or a plurality of elongated electrode portions, and the transparent pixel electrode does not have a plurality of slits or a plurality of elongated electrode portions, the common electrode, the transparent pixel electrode, the transparent insulating layer, and the transparent electrically-conductive layer are arranged in this order from a top layer.

In one embodiment, the semiconductor layer is an oxide semiconductor layer.

Advantageous Effects of Invention

According to an embodiment of the present invention, a TFT substrate can be obtained which has an improved aperture ratio and which is suitably used in display devices.

DESCRIPTION OF EMBODIMENTS

First, the outline of a TFT substrate of an embodiment of the present invention is described.

Figure 1:
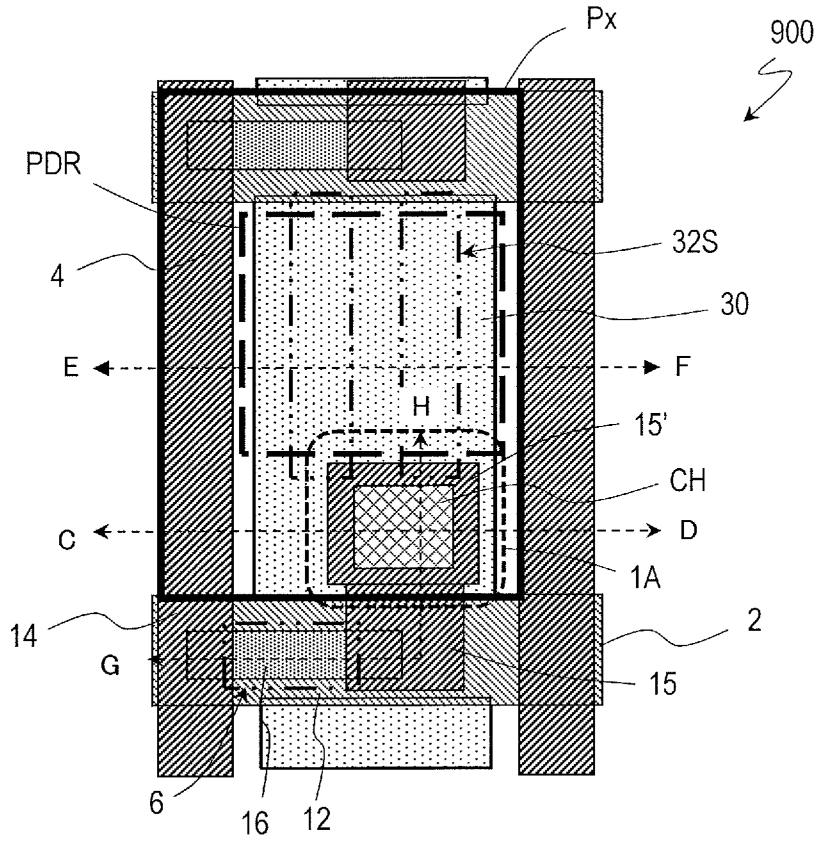
FIG. 1 A plan view showing a region corresponding to generally one pixel of a TFT substrate of Comparative Example 1.
Figure 2:
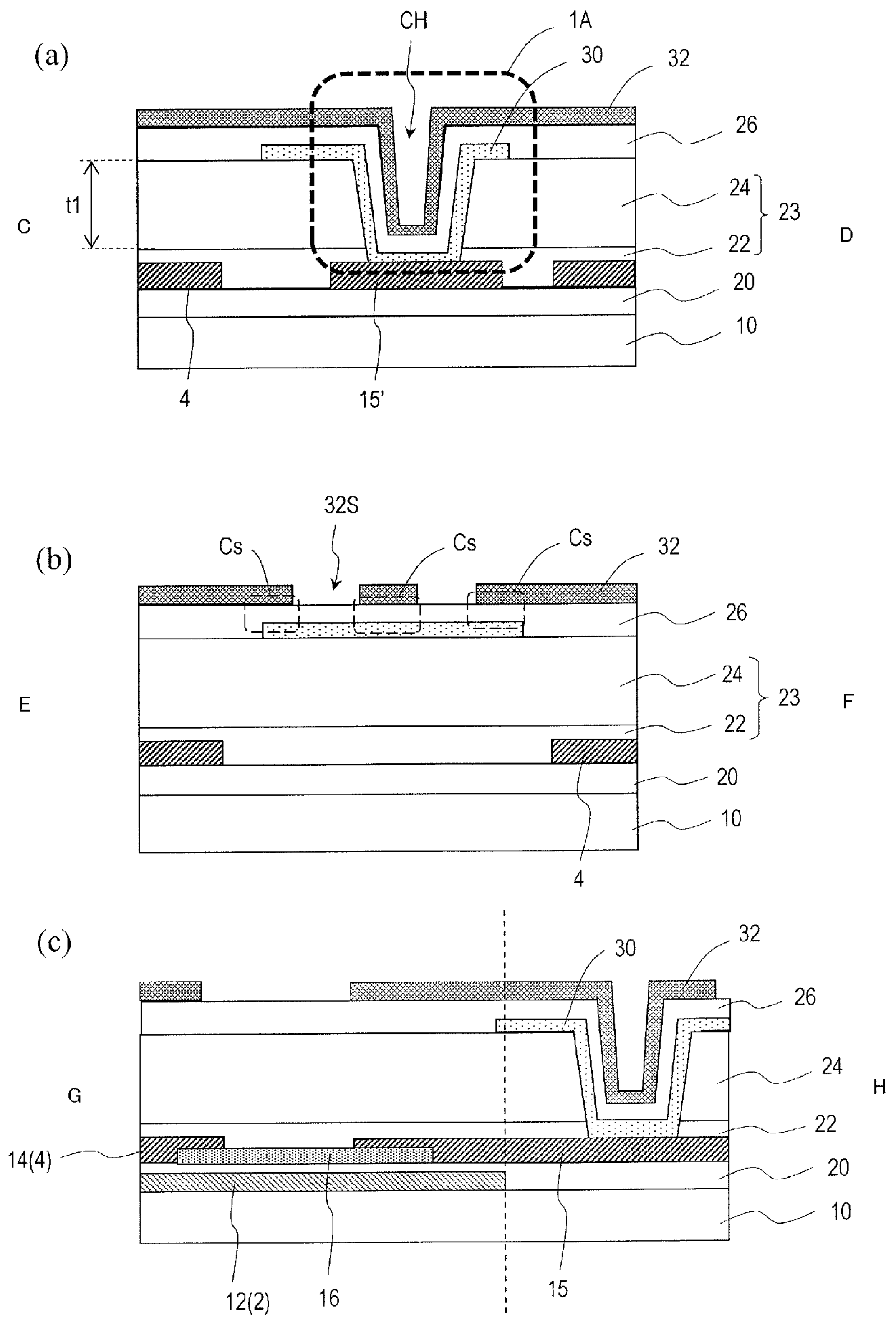
FIG. 2 (*a*) to (*c*) show cross sections taken along line C-D, line E-F and line G-H of FIG. 1.

As a configuration which can improve the pixel aperture ratio, the present applicant has proposed a configuration in which a TFT is provided above a gate line (e.g., WO 2013/073619). FIG. 1 is a plan view showing a TFT substrate 900 (Comparative Example 1) in which a TFT 6 is provided above a gate line 2. FIGS. 2(*a*) to 2(*c*) show cross sections taken along line C-D, line E-F and line G-H of FIG. 1.

Now, firstly, the terms used in this specification, pixel Px, pixel region and effective pixel display region PDR, and pixel aperture ratio, are explained.

The pixel Px means the minimum unit structure for display as shown in FIG. 1 and refers to a unit structure obtained when the display region is equally divided by the number of pixels. The area of one pixel Px can be, typically, defined by the product of the pitch of the gate lines 2 and the pitch of source lines 4 as illustrated herein. The pixel region means a region enclosed by two adjoining gate lines 2 and two adjoining source lines 2 (a region inside the lines). In the form illustrated in FIG. 1, one pixel region is included in one pixel Px.

Note that, however, the pixel Px can be defined in various forms. For example, in the case where a gate line extends through a central portion of each pixel Px, one pixel Px may not correspond to the one pixel region defined above in some cases. However, even in such a form, the area of one pixel Px can be defined by the product of the pitch of the gate lines 2 and the pitch of the source lines 4.

The pixel aperture ratio means the ratio of the area of the effective pixel display region PDR (a region which can be utilized for display) to the area of one pixel Px. In this specification, the effective pixel display region PDR is defined on the TFT substrate and is a portion of the pixel region which does not include the regions of a contact hole and a light-blocking metal wire which cannot be utilized for display.

Hereinafter, the TFT substrate 900 of Comparative Example 1 is described. The TFT substrate 900 of Comparative Example 1 is a TFT substrate 900 for use in a liquid crystal display device which operates in the FFS mode. The TFT substrate 900 includes a pixel electrode 30 which is connected with the TFT 6 and a common electrode 32 which is arranged so as to oppose the pixel electrode 30 via an insulating layer 26.

The common electrode 32 has slits 32S. The slits 32S contribute to produce an electric field including a transverse component (oblique electric field) between the common electrode 32 and the pixel electrode 30. Further, as shown in FIG. 2(*b*), storage capacitances Cs are formed between electrode portions of the common electrode 32 exclusive of the slits (a plurality of elongated electrode portions) and parts of the pixel electrode 30 which oppose the electrode portions.

In the TFT substrate 900 of Comparative Example 1, the source electrode 14 (part of the source line 4), the drain electrode 15 and the channel region (semiconductor layer 16) of the TFT 6 are provided above the gate line 2. By thus forming the TFT 6 outside the pixel region (in a region overlapping the gate line 2 and the source line 4), the aperture ratio can be improved.

Note that, however, in the TFT substrate 900, a contact hole CH for formation of a connecting portion 1A of the drain electrode 15 and the pixel electrode 30 is located in the pixel region. A drain connecting portion 15' residing inside the contact hole CH, which is an extension of the drain electrode 15, is also located in the pixel region.

The contact hole CH is usually formed so as to extend through, for example, a flattening layer 24 (typically, organic insulating layer) and passivation layer 22 (typically, inorganic insulating layer) provided on the TFT 6. Further, since the thickness t1 of the flattening layer 24 is 2 to 3 μm (e.g., 2.5 μm), the depth of the contact hole CH is also about 2 to 3 μm, for example, meaning that it is relatively deep. As such, when used in a liquid crystal display device, liquid crystal molecules inside the contact hole CH and neighboring areas cannot be controlled so as to be in a desired alignment state, and it is difficult to utilize this part for display. Further, since the drain electrode 15 and the drain connecting portion 15' are usually formed by a light-blocking metal film, it is difficult to utilize the aforementioned connecting portion for display in a liquid crystal display device which utilizes light from a backlight for display.

As described above, in many conventional TFT substrates, the contact hole CH is considered as a portion which is not utilized for display. However, in this case, since the size of the contact hole CH is large relative to the pixel size particularly in small-size, high-resolution display devices, the effective pixel display region PDR decreases when the contact hole CH is located in the pixel region, leading to a great decrease of the pixel aperture ratio.

Figure 3:
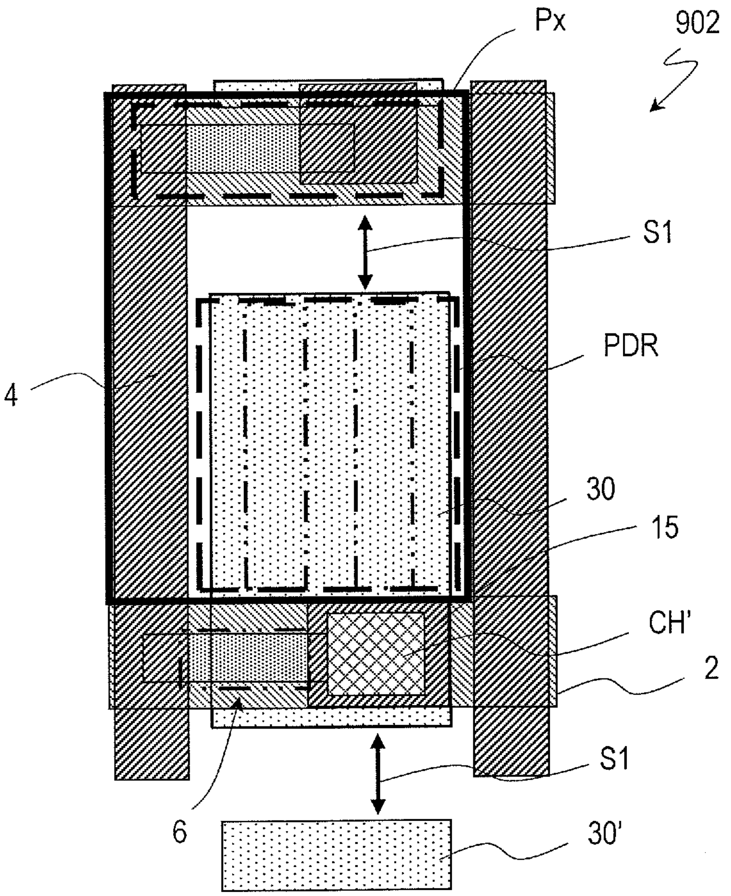
FIG. 3 A plan view showing a region corresponding to generally one pixel of a TFT substrate of Comparative Example 2.

On the other hand, in the TFT substrate 902 (Comparative Example 2) shown in FIG. 3, not only the TFT 6 but also a contact hole CH' formed for connection of the drain electrode 15 and the pixel electrode 30 are provided above the gate line 2. Such a configuration where both the TFT 6 and the contact hole CH' are provided above the gate line 2 is disclosed in, for example, Patent Document 3.

In the TFT substrate 902, the TFT 6 and the contact hole CH' are provided outside the pixel region, and therefore, due to these components, decrease of the pixel aperture ratio is prevented. Thus, it is inferred that the aperture ratio can be higher than in the TFT substrate 900 of Comparative Example 1.

However, in the case where the contact hole CH' for connection of the pixel electrode 30 and the drain electrode 15 is provided above the gate line 2, a portion (lower side portion) of the pixel electrode 30 is arranged so as to cover the gate line 2. In this case, to prevent a short circuit with a neighboring pixel electrode 30', it is necessary to form the pixel electrode 30' of the neighboring pixel so as to be located distant from the gate line 2 (e.g., about 4 μm). Since a short circuit in the pixel electrodes 30, 30' directly leads to a display error, securing a relatively large margin between the pixel electrodes 30, 30' (gap S1 between pixel electrodes) is preferred in consideration of occurrence of film remnants (insufficient etching) in a manufacturing process.

In the case where connection of the pixel electrode 30 and the drain electrode 15 is formed above the gate line 2 as described above, the above-described gap S1 between the pixel electrodes needs to be located in the pixel region. This gap S1 cannot be utilized for display and therefore needs to be shielded with a black matrix or the like. Thus, it was found by the present inventor's research that even when the contact hole CH' is provided above the gate line 2, the effective pixel display region PDR cannot be increased, and it is not easy to increase the pixel aperture ratio.

Figure 4:
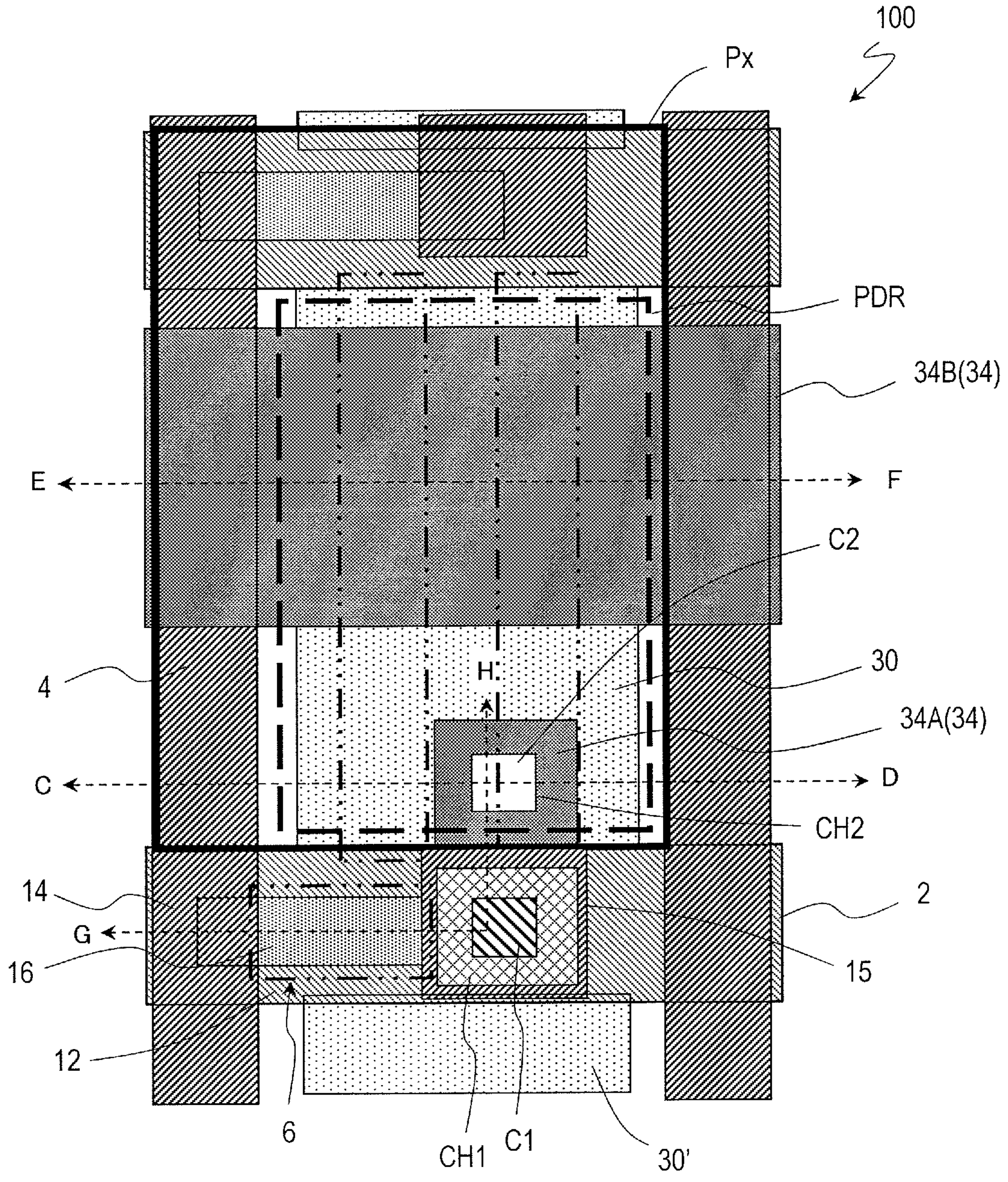
FIG. 4 A plan view showing a region corresponding to generally one pixel of a TFT substrate of Embodiment 1 of the present invention.
Figure 5:
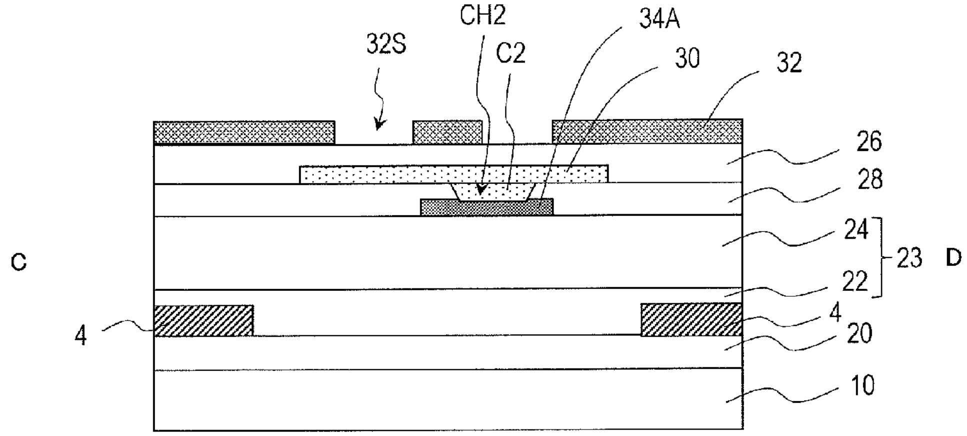
FIG. 5 (*a*) to (*c*) show cross sections taken along line C-D, line E-F and line G-H of FIG. 4.
Figure 5:
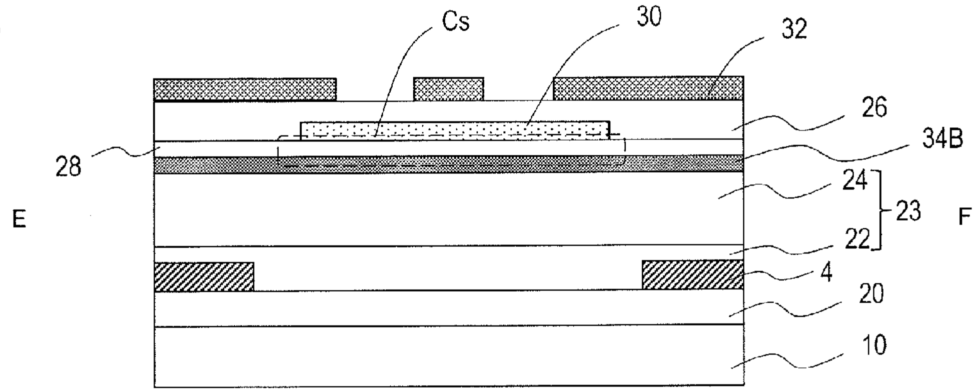
Figure 5:
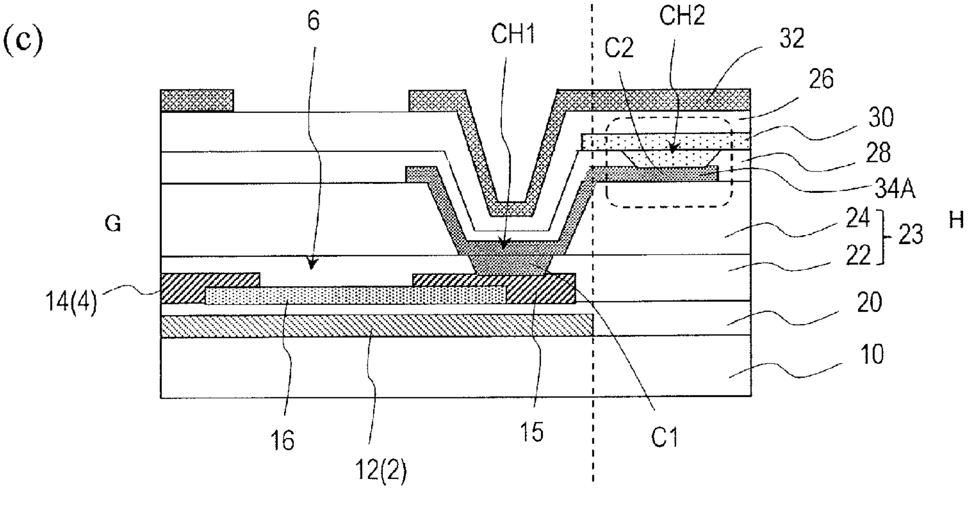

In view of the above, in a TFT substrate 100 of an embodiment of the present invention (see FIG. 4 and FIGS. 5(*a*) to 5(*c*)), an additional transparent electrically-conductive layer 34 is interposed between the pixel electrode 30 and the drain electrode 15. This transparent electrically-conductive layer 34 includes a transparent connecting portion 34A which is used for connection of the drain electrode 15 and the pixel electrode 30 and which is typically in the form of an island.

The transparent connecting portion 34A includes a portion (first connecting portion) C1 which is in contact with the drain electrode 15 and a portion (second connecting portion) C2 which is in contact with the pixel electrode 30. The first connecting portion C1 and the second connecting portion C2 are continuous with each other. At least part of (typically, the entirety of) the second connecting portion C2 is provided at a position which is not present above the gate line 2 (i.e., in the pixel region), whereby the pixel electrode 30 can be formed so as not to overlap the gate line 2 or so as to slightly overlap the gate line 2. Thus, the above-described gap S1 between the pixel electrodes does not need to be located in the pixel region. That is, the lower side edge of the pixel electrode 30 of the upper pixel can be located near the upper side edge of the gate line 2, and the upper side edge of the pixel electrode 30' of the lower pixel can be located near the lower edge of the same gate line 2. In this configuration, generally the entirety of the pixel region that is a region enclosed by the gate lines 2 and the source lines 4 can be utilized for display.

In the arrangement shown in FIG. 4, the second connecting portion C2 of the transparent connecting portion 34A and the transparent electrically-conductive pixel electrode 30 are connected with each other at an opening CH2 provided in an insulating layer 28 (see FIGS. 5(*a*) and 5(*c*)). This connecting portion has transparency when viewed in a direction normal to the substrate and therefore can be utilized for display.

Further, the connection of the transparent connecting portion 34A and the pixel electrode 30 is realized through the opening CH2 provided in the thinner insulating layer 28 (e.g., an inorganic insulating layer having a thickness of 200 nm) rather than through the contact hole CH provided in the conventional flattening layer 24 (e.g., an organic insulating layer having a thickness of 2 to 3 μm). Since the opening CH2 is formed relatively shallow, alignment disturbance of liquid crystal molecules near the opening CH2 is unlikely to occur. Therefore, the region in which the opening CH2 is provided can be utilized for display as well as the other regions in the pixel region. As a matter of course, it is not necessary to cover this region with a light-blocking member.

Further, since the thickness of the insulating layer 28 is small, the opening CH2 can be formed so as to have a smaller planar size (e.g., 2 μm in diameter). The small size opening CH2 is unlikely to interfere with display even if the opening CH2 is located in the pixel region.

In this way, the additional transparent electrically-conductive layer 34 is used to provide at least part of the connecting portion of the drain electrode 15 and the pixel electrode 30 of the TFT 6 (the second connecting portion C2 and the opening CH2) in the pixel region, and this portion is used for display, so that a high pixel aperture ratio can be realized.

Note that, in this specification, the term "transparent" refers to a state where an object lying beyond can be seen through, i.e., a state where light coming from an object lying beyond is visible through a medium. For example, the medium preferably has at least a light transmittance of not less than 70% at the wavelength of $\lambda$=550 nm at which the visual sensitivity is high. If the light transmittance is less than 70%, there is a probability that sufficient display quality cannot be achieved because of decrease in visual recognizability due to brightness.

Specifically, the transparent electrically-conductive layer 34 is preferably formed using a thin film (e.g., 50 to 200 nm) which is made of ITO (indium-tin oxide), IZO (indium-zinc oxide), CuI, $SnO_2$, ZnO, GZO (gallium-zinc oxide), PEDOT or an electrically-conductive polymer such as polyaniline, or electrically-conductive polymers obtained by doping these materials with acceptors.

When employing a configuration where the TFT 6 is provided above the gate line 2, the overlapping area of the drain electrode 15 and the gate electrode 12 of the TFT 6 is somewhat large. In this case, the parasitic capacitance Cgd (the capacitance formed between the gate and the drain) increases, and therefore, there is a problem that the feedthrough voltage is likely to increase.

In order to suppress occurrence of the feedthrough voltage which is attributed to the parasitic capacitance Cgd, it is preferred to further increase the liquid crystal capacitance Clc and the storage capacitance Ccs. This is because as the ratio of the parasitic capacitance Cgd to the total capacitance associated with the pixel (e.g., Clc+Ccs+Cgd; hereinafter, also referred to as "pixel capacitance") increases, the feedthrough voltage also increases. By increasing the pixel capacitance, the aforementioned ratio can be relatively decreased, whereby the feedthrough voltage can be suppressed.

However, increasing the pixel capacitance for the purpose of suppressing the feedthrough voltage can cause such a problem that, in an amorphous silicon TFT, writing cannot be realized at conventional frame frequencies. Thus, in a TFT substrate which employs a conventional amorphous silicon TFT, it is sometimes difficult to employs a configuration in which the contact portion is arranged so as to overlap the gate line.

As a solution to this problem, a semiconductor layer for use as the active layer of the TFT 6 is preferably realized by an oxide semiconductor layer 16, such as an In—Ga—Zn—O oxide semiconductor layer (IGZO layer), for example, as in the embodiment of the present invention.

The oxide semiconductor has higher mobility than the amorphous silicon semiconductor, so that the size of the TFT 6 can be reduced. Using the oxide semiconductor enables writing at a frame frequency which is generally equal to the conventional frame frequencies even when employing a configuration where the pixel capacitance is increased, because the mobility of the oxide semiconductor is high. Therefore, using an oxide semiconductor TFT is effective in suppressing the aforementioned feedthrough voltage that is attributed to the parasitic capacitance Cgd.

Also, as in the embodiment of the present invention, the transparent electrically-conductive layer 34 may include a storage capacitance forming portion 34B which is separated from the above-described transparent connecting portion 34A. The storage capacitance forming portion 34B is arranged so as to oppose the pixel electrode 30 via the insulating layer 28, whereby the storage capacitance Ccs can be increased relatively easily. Thus, since the pixel capacitance can be increased, it is possible to suppress the feedthrough voltage.

Patent Document 4 discloses a configuration where a transparent electrically-conductive layer which is connected with the drain of the TFT is arranged in the pixel region. However, a contact hole for connection of the drain electrode and the pixel electrode is formed deep, and there is a non-transparent metal layer at the bottom of the contact hole. Thus, it is difficult to use this portion for display. In a TFT substrate of Patent Document 4, a contact hole is provided at the central portion of the pixel and utilized as a structure for regulating the alignment of liquid crystal molecules. Thus, this connecting portion is not to be utilized for display.

Hereinafter, active matrix substrates (TFT substrates) of embodiments of the present invention will be described with reference to the drawings, although the present invention is not limited to these examples.

Embodiment 1

FIG. 4 is a schematic plan views showing a region corresponding to generally one pixel of the TFT substrate 100 of Embodiment 1 of the present invention. FIGS. 5(*a*) to 5(*c*) show schematic cross sections taken along line C-D, line E-F and line G-H of FIG. 4. Although not shown, the TFT substrate 100 includes a plurality of pixels arranged in a matrix, and each of the pixels has a configuration shown in FIG. 4 and FIGS. 5(*a*) to 5(*c*). The TFT substrate 100 of Embodiment 1 is used in a liquid crystal display device which operates in the FFS mode.

As shown in FIG. 4 and FIGS. 5(*a*) to 5(*c*), the TFT substrate 100 is constituted using a transparent substrate 10 which is made of glass or the like. On this transparent substrate 10, the gate line 2, the gate electrode 12 that is part of the gate line 2, the gate insulating layer 20 formed on the gate electrode 12, and the oxide semiconductor layer 16 that is arranged so as to overlap the gate electrode 12 with the gate insulating layer 20 interposed therebetween are provided.

The source electrode 14 that is part of the source line 4 and the drain electrode 15 are connected with the oxide semiconductor layer 16. The source electrode 14 and the drain electrode 15 are arranged on the oxide semiconductor layer 16 that is arranged in the form of an island, so as to oppose each other with a gap therebetween. As described herein, the TFT 6 as a switching element is constituted using the gate electrode 12, the oxide semiconductor layer 16, and the source/drain electrodes 14, 15. This TFT 6 (in the present embodiment, the oxide semiconductor TFT 6) is a so-called bottom gate type TFT, in which the gate electrode 12 is provided at a lower level than the oxide semiconductor layer 16.

In the present embodiment, the oxide semiconductor TFT 6 is provided above the gate line 2. In this configuration, the gate electrode 12 is part of the gate line 2 which overlaps the oxide semiconductor layer 16 when viewed in a direction normal to the substrate. The source electrode 14 is part of the source line 4 which is connected with the oxide semiconductor layer 16. In this specification, even such a case is sometimes expressed as "the gate electrode 12 is connected with the gate line 2" or "the source electrode 14 is connected with the source line 4". Note that the line width of the gate line 2 is set to, for example, about 4.5 μm, and the line width of the source line 4 is set to, for example, about 2.5 μm.

On the oxide semiconductor TFT 6, the passivation layer (protection layer) 22 and the flattening layer 24 are provided. In this specification, these are sometimes together referred to as "first insulating layer 23". In this first insulating layer 23, a contact hole CH1 is provided for obtaining a connection of the drain electrode 15 and the transparent connecting portion 34A.

In the TFT substrate 100, the transparent electrically-conductive layer 34 is provided at a higher level than the first insulating layer 23. The transparent electrically-conductive layer 34 includes the transparent connecting portion 34A that is used for connection of the TFT 6 and the pixel electrode 30. The transparent electrically-conductive layer 34 further includes the storage capacitance forming portion 34B that is electrically separated from the transparent connecting portion 34A, such that storage capacitance is formed between the storage capacitance forming portion 34B and the pixel electrode 30.

Among the aforementioned components, the transparent connecting portion 34A is typically in the form of an island and has a portion (first connecting portion) C1 which is in contact with the drain electrode 15 inside the above-described contact hole CH1. The first connecting portion C1 and the contact hole CH1 are provided together with the drain electrode 15 above the gate line 2. That is, the first connecting portion C1 is present outside the pixel region. Note that, in FIG. 5(*c*), the bottom surface portion of the contact hole CH1 is shown as being buried with the first connecting portion C1 of the transparent connecting portion 34A. However, in actuality, the first connecting portion C1 may have a shape which conforms to the shape of the contact hole CH1.

The transparent connecting portion 34A is formed integrally with the first connecting portion C1 and has a portion extending from the first connecting portion C1 to the inside of the pixel region. This portion forms a connecting portion (second connecting portion) C2 that is connected with the pixel electrode 30. That is, the second connecting portion C2 is provided at a position which does not overlap the gate line 2 and is located in the pixel region.

The second connecting portion C2 is a portion which is present outside the contact hole CH1 that is formed in the first insulating layer 23 and is a portion which is drawn up onto the first insulating layer 23 through the contact hole CH1 and is at a higher level than the first insulating layer 23.

As described hereinabove, in the present embodiment, the transparent connecting portion 34A is configured to include the first connecting portion C1 which is present above the gate line 2 (outside the pixel region) and the second connecting portion C2 which is not present above the gate line 2 (inside the pixel region). These portions are near to each other. The first connecting portion C1 and the second connecting portion C2 are connected with each other as if they crawl along the lateral wall of the contact hole CH1.

The transparent insulating layer 28 is provided on the transparent electrically-conductive layer 34. Also, the transparent pixel electrode 30 is provided on the transparent insulating layer 28. At a portion of the transparent insulating layer 28 corresponding to the second connecting portion C2 of the transparent connecting portion 34A, the opening CH2 is provided. In the opening CH2, the second connecting portion C2 (transparent connecting portion 34A) and the pixel electrode 30 are in contact with each other. In this specification, the transparent insulating layer 28 that is thus provided between the transparent connecting portion 34A and the pixel electrode 30 is sometimes referred to as "second insulating layer 28". Note that, in FIG. 5(*c*), the bottom surface portion of the opening CH2 is shown as being buried with the pixel electrode 30. However, in actuality, the pixel electrode 30 may have a shape which conforms to the shape of the opening CH2 and may have a recess in its surface.

The pixel electrode 30 is provided for each pixel Px. Typically, the pixel electrode 30 is configured so as to spread across generally the entirety of a region enclosed by the gate lines 2 and the source lines 4 (pixel region). The pixel electrode 30 is realized by, for example, patterning an ITO film or IZO film which has a thickness of about 100 nm. It is preferred that the pixel electrode 30 does not cover the entirety of the first connecting portion C1 of the transparent connecting portion 34A when viewed in a direction normal to the substrate. That is, it is preferred that the pixel electrode 30 does not at least partially overlap the first connecting portion C1 of the transparent connecting portion 34A.

As understood from the above description, in the present embodiment, the region in which the second connecting portion C2 is provided is configured so as to be capable of transmitting light when viewed in a direction normal to the substrate. In this specification, the portion in which the second connecting portion C2 and the pixel electrode 30 are connected with each other is sometimes referred to as "transparent contact portion".

Note that, in the region in which the second connecting portion C2 is provided, a metal film is provided at a lower level than the second connecting portion C2 in some of the embodiments which will be described later. Note that, however, also in this case, in the region in which the second connecting portion C2 is provided, at least components ranging from the second connecting portion C2 to the pixel electrode 30 are configured to allow transmission of light.

Here, the first insulating layer 23 includes the flattening layer 24 and therefore has a relatively large thickness. The flattening layer 24 is formed by, for example, a photosensitive organic insulating film and has a thickness of not less than about 1 μm and not more than about 3 μm. On the other hand, the second insulating layer 28 is, typically, formed by an inorganic insulating film, such as a $SIN_x$ film or $SiO_2$ film, and has a thickness of not less than about 10 nm and not more than about 500 nm, for example.

Thus, the depth of the contact hole CH1 that is provided so as to overlap the gate line 2 is generally not less than 1 μm and not more than 3 μm, meaning that it is relatively deep. On the other hand, the depth of the opening CH2 that is provided so as not to overlap the gate line 2 is generally not less than 10 nm and not more than about 500 nm, meaning that it is relatively shallow. In the present embodiment, the depth of the contact hole CH1 is set deeper than the depth of the opening CH2. The ratio of the depth of the opening CH2 to the depth of the contact hole CH1 is typically set in a range of not less than 1/100and less than 1/1.

Further, as described above, the transparent electrically-conductive layer 34 includes the storage capacitance forming portion 34B. The storage capacitance forming portion 34B is arranged so as to oppose the pixel electrode 30 via the second insulating layer 28 and is used for forming storage capacitance Cs between the storage capacitance forming portion 34B and the pixel electrode 30. To obtain appropriate storage capacitance, the storage capacitance forming portion 34B may be supplied with an applied voltage which is, for example, equal to that supplied to the common electrode 32 which will be described later.

The storage capacitance forming portion 34B is separate from the transparent connecting portion 34A and is therefore a portion which is electrically separate from the TFT 6 and the pixel electrode 30. The storage capacitance forming portion 34B may have an arbitrary form. Specifically, the storage capacitance forming portion 34B may be divided into parts corresponding to respective ones of the pixels or may be commonly provided to a plurality of pixels. When it is commonly provided to a plurality of pixels, the storage capacitance forming portion 34B may have a form which spreads across the entire surface of the TFT substrate 100 except that it has openings at positions corresponding to the transparent connecting portion 34A of respective pixels. Note that the storage capacitance forming portion 34B may be interposed between the source line 4 and the pixel electrode 30, such that the storage capacitance forming portion 34B also functions as a shield electrode between these components.

In the thus-provided transparent electrically-conductive layer 34, the transparent connecting portion 34A preferably has the following configuration. It is desirable that the transparent connecting portion 34A is capable of functioning as an etching stopper in formation of the opening CH2 in the insulating layer 28 and is made of a low-resistance material. This is because, if it should not function as an etching stopper, the bottom of the opening CH2 would be broken through, so that a sufficient contact area of the pixel electrode 30 and the transparent contact portion C2 would not be secured, and the contact resistance would increase. Further, etching would advance to an underlying film to cause damage. If the electric resistance of the transparent connecting portion 34A should be high, the charging rate of the pixels would disadvantageously decrease. Preferred examples of specific materials which can be used for the transparent connecting portion 34A include ITO and IZO.

It is desirable that the transparent insulating film 28 that is provided between the transparent connecting portion 34A and the pixel electrode 30 has a small thickness. Further, it is desirable that the transparent insulating film 28 has a high dielectric constant and is an inorganic insulating film. The reasons for that are described below.

The conventional contact hole CH is provided in the flattening layer 24 and therefore has a step of about 2 to 3 μm. When the contact hole CH is provided in the flattening layer 24 that is typically formed by an organic interlayer insulating film, it is difficult to increase the development resolution. Therefore, there is a problem that the opening diameter increases to about 5 μm. On the other hand, an opening provided in the transparent insulating layer 28 is shallow, so that the size of the step at the contact portion can be reduced. Further, the opening diameter is about 3 μm. Thus, variation in the cell thickness of the liquid crystal layer is limited. Further, the influence on paining of the alignment film and the surface treatments on the TFT substrate such as rubbing and photo-alignment treatment can be reduced.

In the case where the storage capacitance forming portion 34B is provided, forming the transparent insulating layer 28 with the use of a material of high dielectric constant so as to have a small thickness provides an advantage that large capacitance can be secured in a small area. When it is made of an inorganic material, it is possible to employ dry etching, and the contact portion can be easily formed so as to have a small size.

Examples of specific materials which can be used as the transparent insulating layer 28 include $SiO_2$ and $SiN_x$. The film thickness is preferably about 10 to 500 nm because an excessively small film thickness causes the problem of decrease in the yield, such as a leakage failure between the upper and lower electrodes. The size of the opening CH2 formed in the transparent insulating layer 28 can be set to about 2 μm by employing dry etching.

As described above, the connection of the pixel electrode 30 and the TFT 6 is formed at a transparent contact portion provided in the pixel region using the transparent connecting portion 34A. Therefore, the pixel electrode 30 may be formed so as not to cover (or so as to slightly cover) the gate line 2. Since the gap S1 extending to the adjacent pixel electrode 30' resides in a region lying above the gate line 2, the upper side edge of the adjacent pixel electrode 30' can be located near that gate line 2. Accordingly, a large effective pixel display region PDR can be secured within one pixel Px.

On the pixel electrode 30, a third insulating layer 26 is provided. On the third insulating layer 26, the common electrode 32 is provided. The common electrode 32 is arranged so as to oppose the pixel electrode 30 via the third insulating layer 26. Note that the third insulating layer 26 is an insulating layer which is provided between the pixel electrode 30 and the common electrode 32, and is an insulating layer which is also provided in a conventional FFS mode liquid crystal display device.

In the TFT substrate 100 for use in a FFS mode liquid crystal display device, the common electrode 32 has slits 32S extending in a predetermined direction (elongated openings represented by two-dot chain lines in FIG. 4). In the shown arrangement, the direction of extension of these slits 32S is generally parallel to the source line 4, although it can be arbitrarily selected.

The common electrode 32 may have a shape corresponding to one pixel or may be commonly provided to a plurality of pixels. In the case where the common electrode 32 has a shape corresponding to one pixel, the common electrodes 32 corresponding to a plurality of pixels may be connected together by a common line (not shown).

Note that the common electrode 32 preferably has an opening above the TFT 6 so as not to cover the TFT 6 as shown in FIG. 5(*c*). This is for the purpose of reducing the probability of operation errors of the bottom gate type TFT 6 due to the influence of the potential of the common electrode 32. Note that, however, in the case where a shield electrode is provided between the TFT 6 and the common electrode 32, the common electrode 32 does not need to have the opening above the TFT 6. Although providing a plurality of openings in the common electrode 32 leads to a shape which is constituted of elongated electrode portions, a redundant design is employed in which the common electrodes 32 are in a reticulate arrangement such that errors do not occur even if disconnection occurs in some parts.

A liquid crystal display device can be obtained using the thus-configured TFT substrate 100. The obtained liquid crystal display device includes the TFT substrate 100, a counter substrate (e.g., a transparent substrate including a color filter and black matrix) which is arranged so as to oppose the TFT substrate 100, and a liquid crystal layer held between these substrates.

Typically, a backlight is provided at the rear surface side of the TFT substrate 100, whereby a transmissive liquid crystal display device is obtained which performs display with the utilization of light from the backlight. Using the TFT substrate 100 improves the utilization efficiency of light from the backlight.

For example, when the TFT substrate 100 of an embodiment of the present invention is used in a 500 ppi high-resolution display device, the transmittance which is defined by the ratio of the effective pixel display area PDR to the entire area of pixel Px is 67%. This means a great improvement as compared with the transmittance of a conventional 500 ppi display device which is, for example, about 50%.

Note that, in the transverse electric field mode, a horizontal alignment film (not show) that is provided on the TFT substrate 100 so as to be in contact with the liquid crystal layer is used for providing the initial alignment of liquid crystal molecules such that the pretilt angle (the angle between the longitudinal direction of liquid crystal molecules in the absence of an applied voltage and the substrate surface: elevation angle) is not more than 1°, for example. The horizontal alignment film also defines the initial alignment azimuth of liquid crystal molecules (the direction in which the longitudinal axis of liquid crystal molecules is oriented in the substrate surface) in the absence of an applied voltage. Such a horizontal alignment film can be realized by, for example, performing a rubbing treatment or a photo-alignment treatment on an alignment film material, such as polyimide.

In the case of a normally-black mode operation, typically, the outer side of the TFT substrate 100 and the outer side of the counter substrate are provided with a pair of polarizing elements which are in a crossed Nicols arrangement. The above-described initial alignment azimuth of liquid crystal molecules is typically set generally parallel to or generally perpendicular to the polarization axes of the polarizing elements.

In the FFS mode liquid crystal display device, the material which forms the liquid crystal layer is preferably a negative type liquid crystal material which has a negative dielectric anisotropy. In this case, the longitudinal axis of liquid crystal molecules is oriented in a direction perpendicular to the electric field, so that the alignment disturbance can be relatively small even in the presence of an oblique electric field.

The TFT substrate 100 used in a FFS mode display device has the following advantages. Due to limitations on the processing accuracy in the line width/line space and the contact diameter which are incurred by the increase in resolution, providing an opening pattern (e.g., the slits 32S of the common electrode 32) causes the necessity of reducing the area of the electrode portion. Here, in the FFS mode, the pixel storage capacitance is formed at the overlapping portion of the common electrode 32 and the pixel electrode 30. However, as the resolution increases, this overlapping area decreases (pixel storage capacitance area/pixel electrode area decreases), so that securing a sufficient capacitance is difficult. Therefore, there is a probability that flicker occurs, and this causes adverse effects on the display quality. As the line width/line space (slit) decreases, variation of the processing accuracy in the line width/line space increases, and variation of the pixel storage capacitance value increases, so that there is a probability that flicker occurs, and this causes adverse effects on the display quality. On the other hand, in the case where the additional transparent electrically-conductive layer 34 is provided as in the TFT substrate 100, the storage capacitance forming portion 34B can be formed so as to have a relatively large area together with the connecting portion 34A of the TFT 6 and the pixel electrode 30 in the same layer. Therefore, a sufficient storage capacitance can be secured. Thus, when used in a high-resolution FFS mode TFT substrate, a configuration where the above-described transparent electrically-conductive layer 34 is provided is particularly advantageous.

Although the TFT substrate 100 of Embodiment 1 has been described hereinabove, various modifications are possible as a matter of course. In the following section, Variations 1 to 9 of Embodiment 1 are described. In the descriptions of Variations 1 to 9, elements which are the same as those of the TFT substrate 100 of Embodiment 1 are designated by the same reference numerals, and the description thereof is herein omitted.

Figure 6:
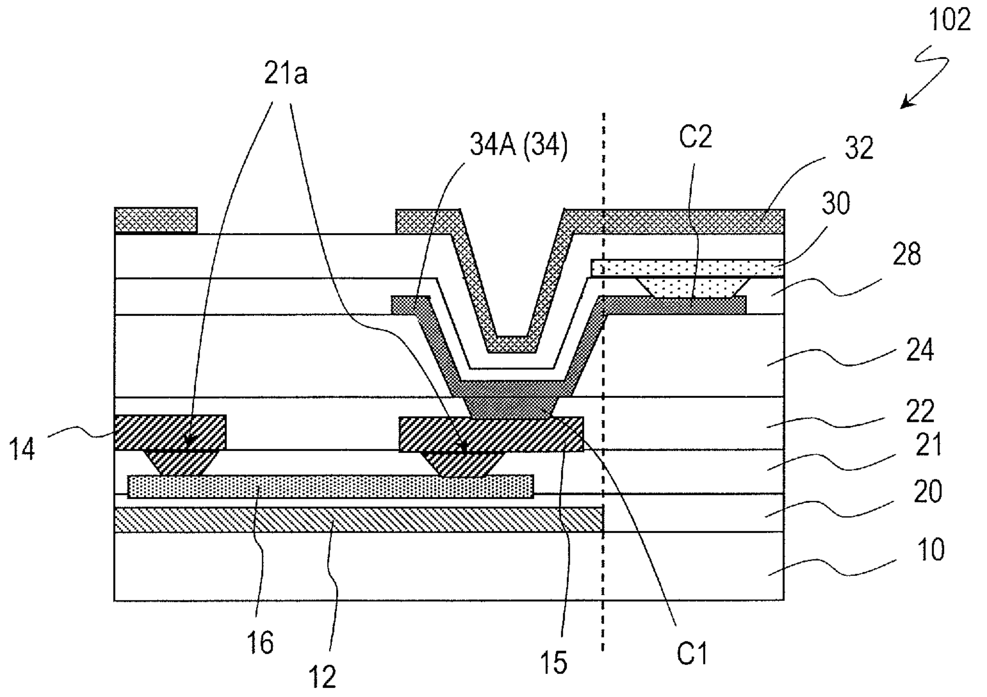
FIG. 6 A cross-sectional view showing the configuration of a TFT substrate of Variation 1 of Embodiment 1.

FIG. 6 shows a cross section of a TFT substrate 102 of Variation 1 of Embodiment 1. In the TFT substrate 102, an etching stopper layer 21 is provided on the oxide semiconductor layer 16. The source electrode 14 and the drain electrode 15 are connected with the oxide semiconductor layer 16 via openings 21*a* provided in the etching stopper layer 21.

In the arrangement where the etching stopper layer 21 is thus provided, at the step of forming the source electrode 14 and the drain electrode 15 by patterning a metal film which is made of aluminum or the like, etching damage on the channel region of the oxide semiconductor layer 16 can be prevented due to the presence of the etching stopper layer 21 which serves as an underlayer. Therefore, the device characteristics of the oxide semiconductor TFT 6 can be improved.

Figure 7:
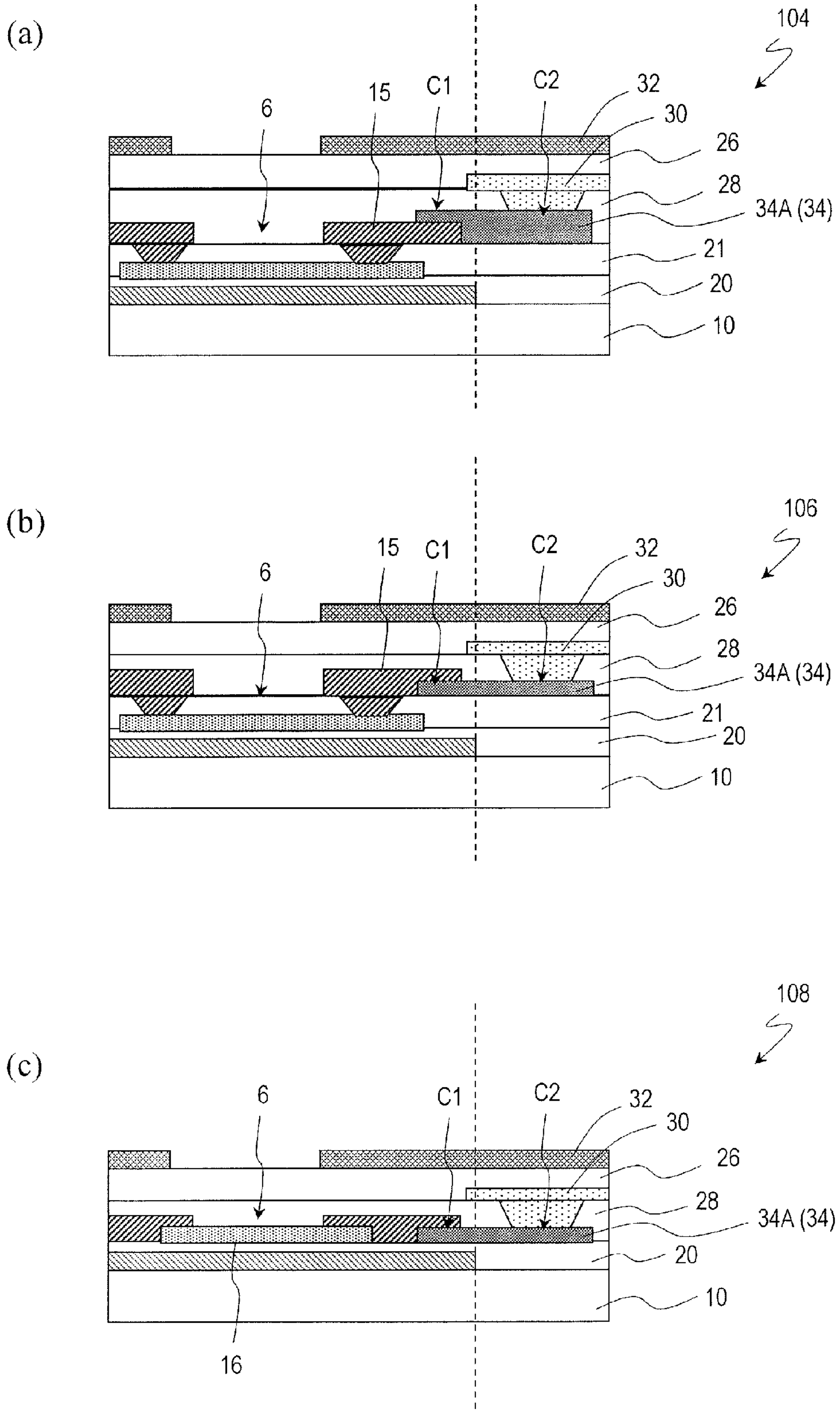
FIG. 7 (*a*) to (*c*) are cross-sectional views showing the configurations of TFT substrates of Variations 2 to 4 of Embodiment 1.

FIG. 7(*a*) shows a cross section of a TFT substrate 104 of Variation 2. In the TFT substrate 104, the passivation layer 22 and the flattening layer 24 of the TFT substrate 102 shown in FIG. 6 do not exist, and the first connecting portion C1 and the second connecting portion C2 of the transparent connecting portion 34A are provided at the same level. Note that the TFT substrate 104 is equal to the TFT substrate 102 of Variation 1 in that the first connecting portion C1 is provided above the gate line 2 and that the second connecting portion C2 (or transparent contact portion) is provided in the pixel region.

The second insulating layer 28 that covers the transparent connecting portion 34A is realized by an inorganic insulating film. Through an opening provided in this film, the pixel electrode 30 and the transparent connecting portion 34A are connected with each other. Note that this second insulating layer 28 also functions as a passivation layer which covers the TFT 6.

In the TFT substrate 104, the interlayer insulating layers (first insulating layer and second insulating layer) provided between the drain electrode 15 and the pixel electrode 30 can be realized by a single layer, and therefore, the manufacturing cost can be reduced.

FIG. 7(*b*) shows a cross section of a TFT substrate 106 of Variation 3. The TFT substrate 106 is different from the TFT substrate 104 of Variation 2 in that, in the first connecting portion C1, the upper surface of the transparent connecting portion 34A is in contact with the drain electrode 15.

The drain electrode 15 is formed using a multilayer film in which Al is interposed, such as Ti/Al/Ti, in some cases. The transparent connecting portion 34A is made of ITO in some cases. In this case, in the configuration shown in FIG. 7(*a*), the transparent connecting portion 34A is formed after formation of the drain electrode 15, and therefore, deposition of the ITO film is carried out while Al is exposed at the lateral surface of the drain electrode 15. In this process, Al and ITO are in contact with each other, so that corrosion by galvanization (galvanic corrosion) between these parts occurs in some cases.

On the other hand, in the TFT substrate 106, the formation step of the drain electrode 15 is carried out after the step of forming the transparent connecting portion 34A. Therefore, contact of Al with ITO can be prevented although Ti of the underlying layer which forms the drain electrode 15 is in contact with ITO. Therefore, occurrence of galvanic corrosion can be prevented, and an improvement of the yield can be expected.

FIG. 7(*c*) shows a cross section of a TFT substrate 108 of Variation 4. In the TFT substrate 108, the transparent electrically-conductive layer 34 (transparent connecting portion 34A) is provided in the same layer as the oxide semiconductor layer 16 (i.e., on the gate insulating layer 20). On these components, the source line 4, the source electrode 14, the drain electrode 15, etc., are provided. The lower surface of the drain electrode 15 is in contact with the oxide semiconductor layer 16 and the transparent connecting portion 34A. The thus-formed TFT 6 has a top contact configuration (a configuration where the upper surface of the oxide semiconductor layer 16 is in contact with the source and the drain).

In the TFT substrate 108, the transparent insulating layer 28 that is provided between the transparent electrically-conductive layer 34 and the pixel electrode 30 also functions as a passivation layer which covers the TFT 6. In such a configuration, the steps of forming insulating layers can be reduced, and therefore, the manufacturing cost can be reduced. Further, since the etching stopper layer 21 such as shown in FIG. 7(*b*) and the openings for connection of the oxide semiconductor layer 16 with the source and the drain are not provided, the size of the TFT 6 can be further reduced, and a still higher aperture ratio can be achieved.

Figure 8:
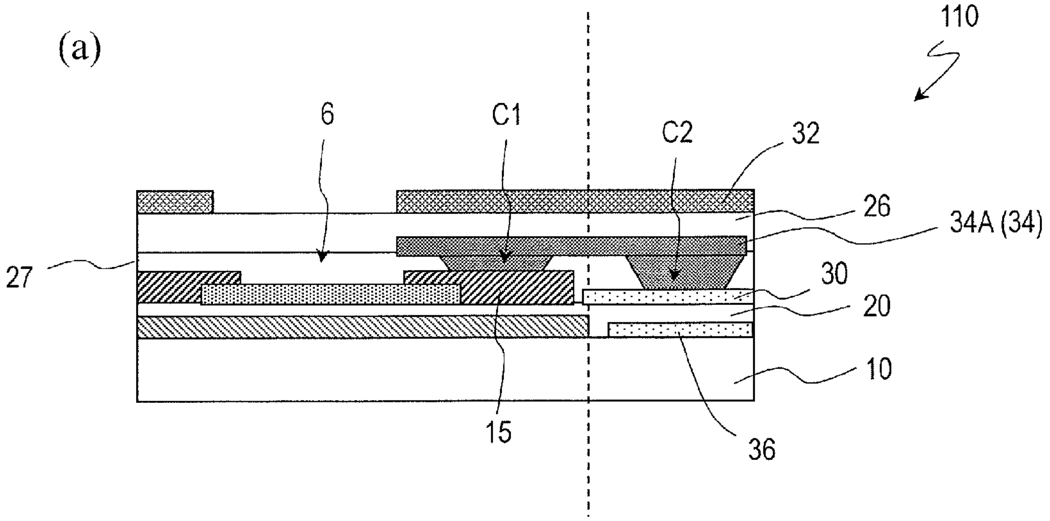
FIGS. 8 (*a*) and (*b*) are cross-sectional views showing the configurations of TFT substrates of Variations 5 and 6 of Embodiment 1.
Figure 8:
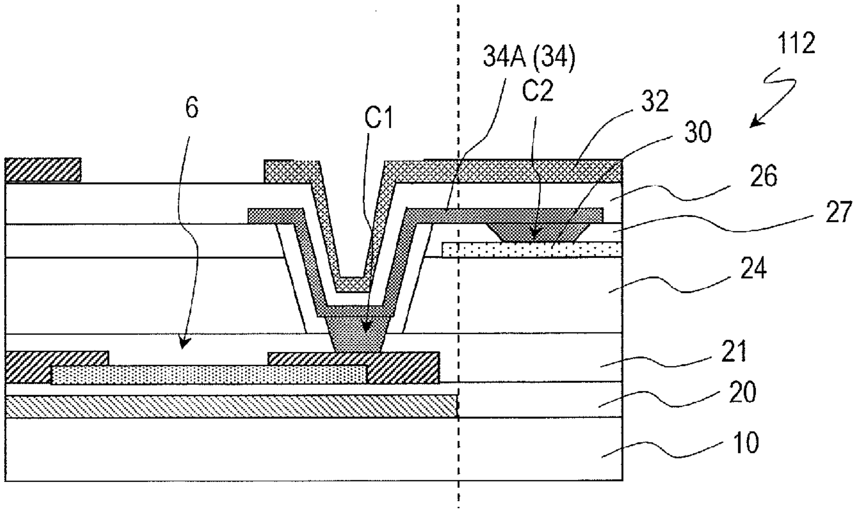

FIG. 8(*a*) shows a cross section of a TFT substrate 110 of Variation 5 of Embodiment 1. In the TFT substrate 110, the pixel electrode 30 is provided at a lower level than the transparent electrically-conductive layer 34. An insulating layer 27 is provided between the pixel electrode 30 and the transparent connecting portion 34A. The pixel electrode 30 and the transparent connecting portion 34A are in contact with each other in an opening provided in the insulating layer 27.

When the pixel electrode 30 is in such an arrangement, storage capacitance is formed between the pixel electrode 30 and the storage capacitance forming portion 34B of the transparent electrically-conductive layer 34, and furthermore, still larger storage capacitance can be obtained using a transparent electrically-conductive layer 36 provided in the same layer as the gate line 2. Note that, in this specification, even such a form is sometimes expressed as "the transparent electrically-conductive layer 34 is provided (interposed) between the drain electrode 15 and the pixel electrode 30".

Note that, in the case where the pixel electrode 30 and the drain electrode 15 are provided in the same layer as in the TFT substrate 110, an insulating layer may be provided between the drain electrode 15 and the adjacent pixel electrode 30' in order to effectively prevent a short circuit between these components.

FIG. 8(*b*) shows a cross section of a TFT substrate 112 of Variation 6. The TFT substrate 112 is an example which is obtained by applying a form where the pixel electrode 30 is provided at a lower level than the transparent electrically-conductive layer 34, such as in the TFT substrate 110 shown in FIG. 8(*a*), to the configuration of the TFT substrate 100 of Embodiment 1.

Figure 9:
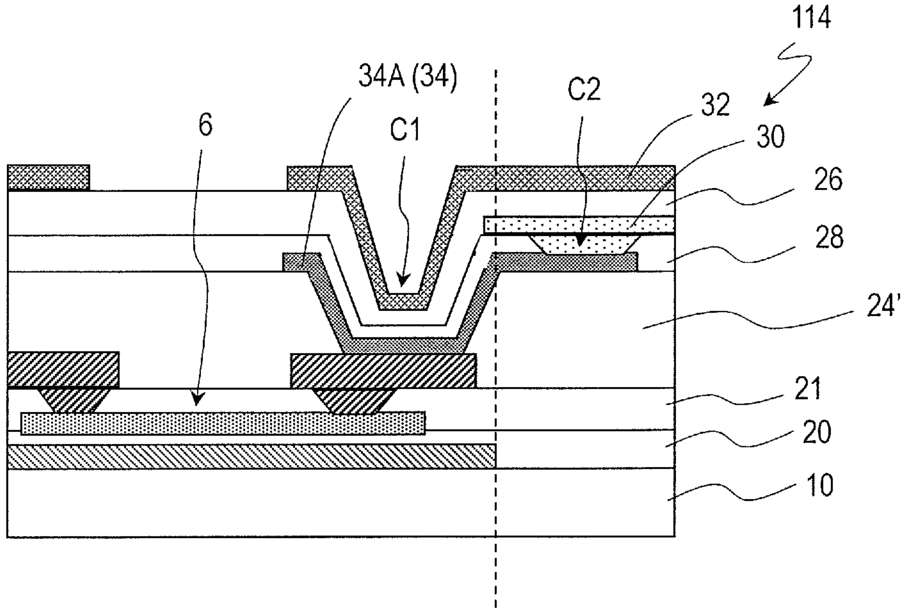
FIGS. 9 (*a*) and (*b*) are cross-sectional views showing the configurations of TFT substrates of Variations 7 and 8 of Embodiment 1.
Figure 9:
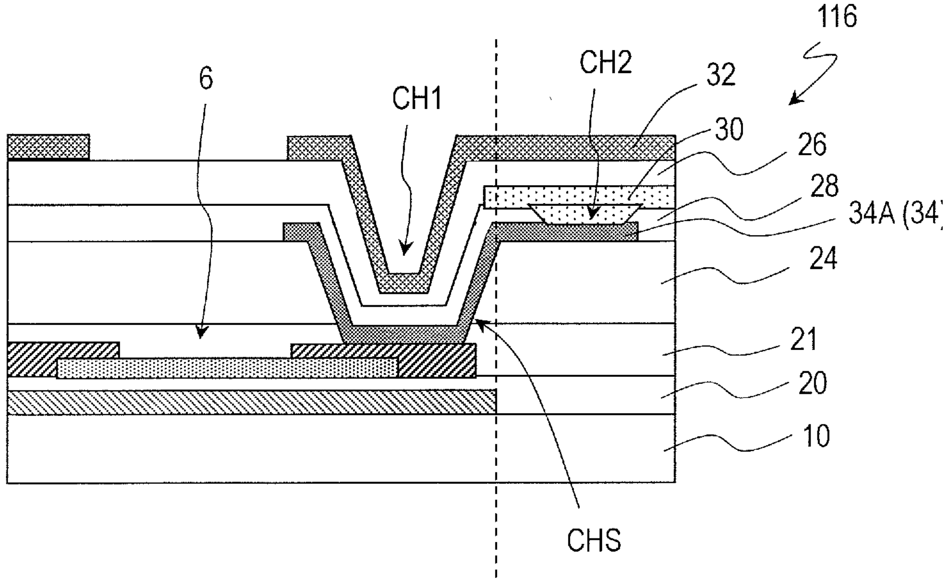

FIG. 9(*a*) shows a cross section of a TFT substrate 114 of Variation 7. The TFT substrate 114 has a form where the passivation layer 22 that covers the TFT 6 is omitted from the TFT substrate 104 of Variation 2 shown in FIG. 7(*a*). In this configuration, a flattening film 24' covers the TFT 6. Such an arrangement enables to omit the step of forming the passivation layer 22 and the step of forming a contact hole in the passivation layer 22 and hence reduce the manufacturing cost.

FIG. 9(*b*) shows a cross section of a TFT substrate 116 of Variation 8. The TFT substrate 116 represents a case where, in the TFT substrate 100 shown in FIGS. 5(*a*) to 5(*c*), the contact hole CH1 passing through the passivation layer 22 and the flattening layer 24 is formed through a single process. In this case, the two steps, the step of forming a contact hole in the passivation layer 22 and the step of forming a contact hole in the flattening layer 24 so as to overlap the contact hole formed in the passivation layer 22, can be merged together. Therefore, the manufacturing process can be simplified.

Further, in the lateral wall CHS of the contact hole CH1, formation of a step at the boundary portion between the passivation layer 22 and the flattening layer 24 is prevented. Thus, breakage at a step of the transparent connecting portion 34A formed along the lateral wall is prevented, so that excellent electrical conductivity can be maintained.

A form where the common electrode 32 that has the slits 32S is provided above the pixel electrode 30 with an insulating layer interposed therebetween has been described above as a form which complies with the FFS mode, although the TFT substrate of the present invention is not limited to this form. An arrangement may be possible in which the common electrode 32 is provided above the transparent electrically-conductive layer 34 with an insulating layer interposed therebetween, and the pixel electrode 30 is provided above the common electrode 32 with an insulating layer interposed therebetween. This arrangement will be described in detail in the following section.

Figure 10:
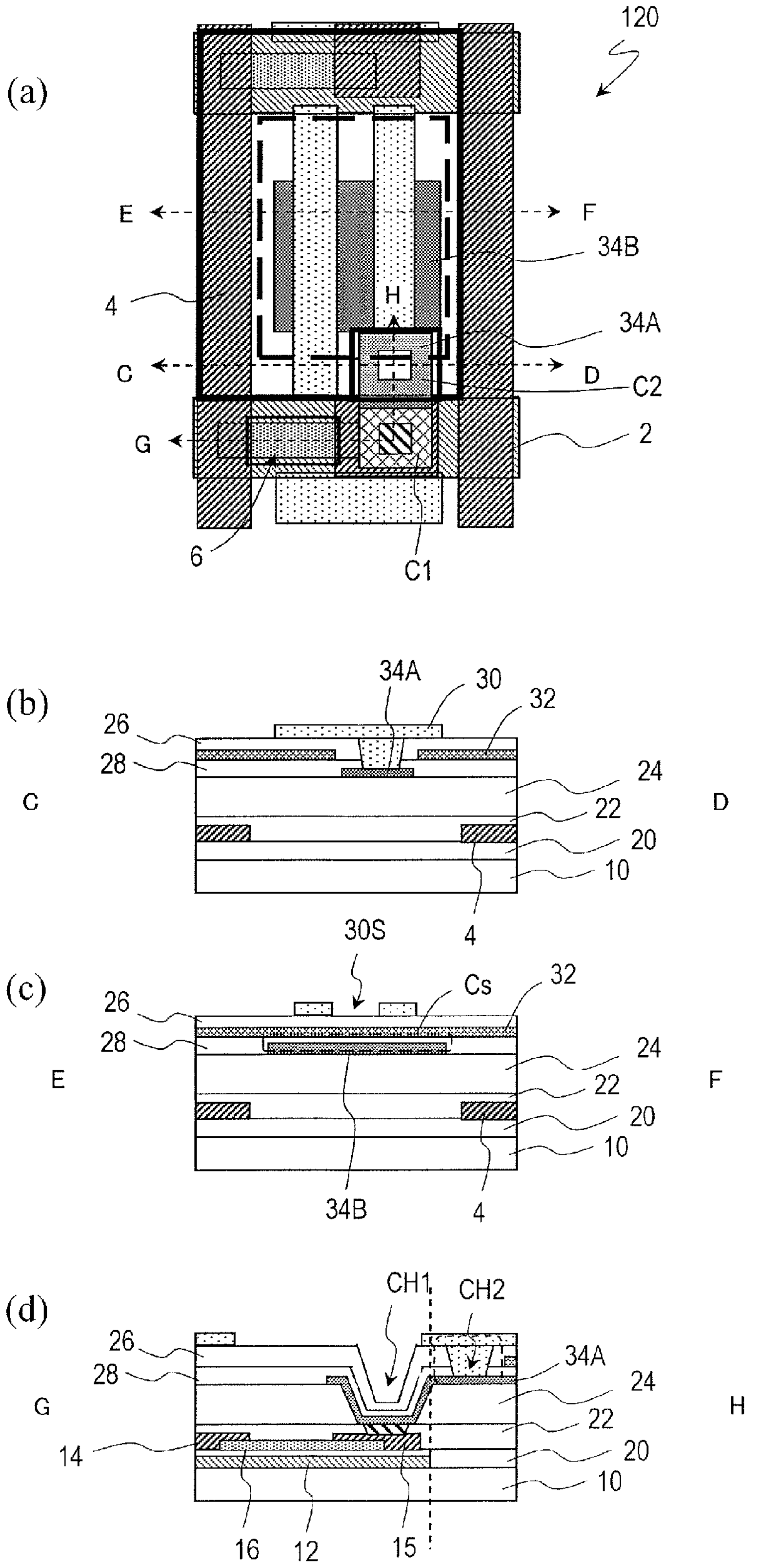
FIG. 10 Diagrams showing the configuration of a TFT substrate of Variation 9 of Embodiment 1. (a) is a plan view showing a region corresponding to generally one pixel. (b) to (d) are cross-sectional views taken along line C-D, line E-F and line G-H of (a).

FIGS. 10(*a*) to 10(*d*) show a TFT substrate 120 (Variation 9) which is configured such that the pixel electrode 30 which has a slit 30S is provided in an upper layer, and the common electrode 32 is provided under the pixel electrode 30 with the third insulating layer 26 interposed therebetween. FIG. 10(*a*) is a plan view. FIGS. 10(*b*) to 10(*d*) show schematic cross sections taken along line C-D, line E-F and line G-H of FIG. 10(*a*).

In the TFT substrate 120, the transparent connecting portion 34A and the pixel electrode 30 are connected with each other in the opening CH2 extending through two insulating layers (the second insulating layer 28 and the third insulating layer 26). The common electrode 32 that is interposed between these two insulating layers has an opening so as not to be in contact with the transparent connecting portion 34A or the pixel electrode 30 outside the opening CH2.

As described above, an opening extending through two insulating layers is provided at the transparent contact portion in which connection of the pixel electrode 30 and the transparent connecting portion 34A is achieved. Each of these insulating layers can be formed using an inorganic insulating film, or the like, so as to have a relatively small thickness. Therefore, this transparent contact portion can be utilized for display. Note that, also in the TFT substrate 120, the first connecting portion C1 of the transparent connecting portion 34A is provided above the gate line 2, and the second connecting portion C2 is provided in the pixel region, as in the TFT substrate 100.

The TFT substrate of the present embodiment which has been described above can be manufactured using a conventional manufacturing method. Note that, however, since the additional transparent electrically-conductive layer 34 is provided, the step of forming the transparent electrically-conductive layer 34 is carried out after formation of the first insulating layer 23 (e.g., the passivation layer 22 and the organic interlayer insulating layer 24) and the contact hole CH1.

The transparent electrically-conductive layer 34 can be obtained by appropriately patterning a transparent electrically-conductive film (e.g., 100 nm in thickness), such as ITO, through a photolithography process.

Further, the step of providing the second insulating layer 28 that covers the transparent electrically-conductive layer 34 is carried out. The second insulating layer 28 is obtained by forming an inorganic electrically-conductive film of $SiN_x$ or $SiO_2$ (e.g., 100 nm in thickness). Further, an opening 28*a* through which the second connecting portion C2 is to be exposed is formed by dry etching, or the like, and thereafter, the pixel electrode 30 and relevant elements may be provided as in conventional procedures.

In TFT substrates of the other variations, the steps of forming the transparent electrically-conductive layer 34 and the second insulating layer 28 can be easily realized using the same processes as the conventional pixel electrode formation step and inorganic insulating film formation step.

Embodiment 2

Figure 11:
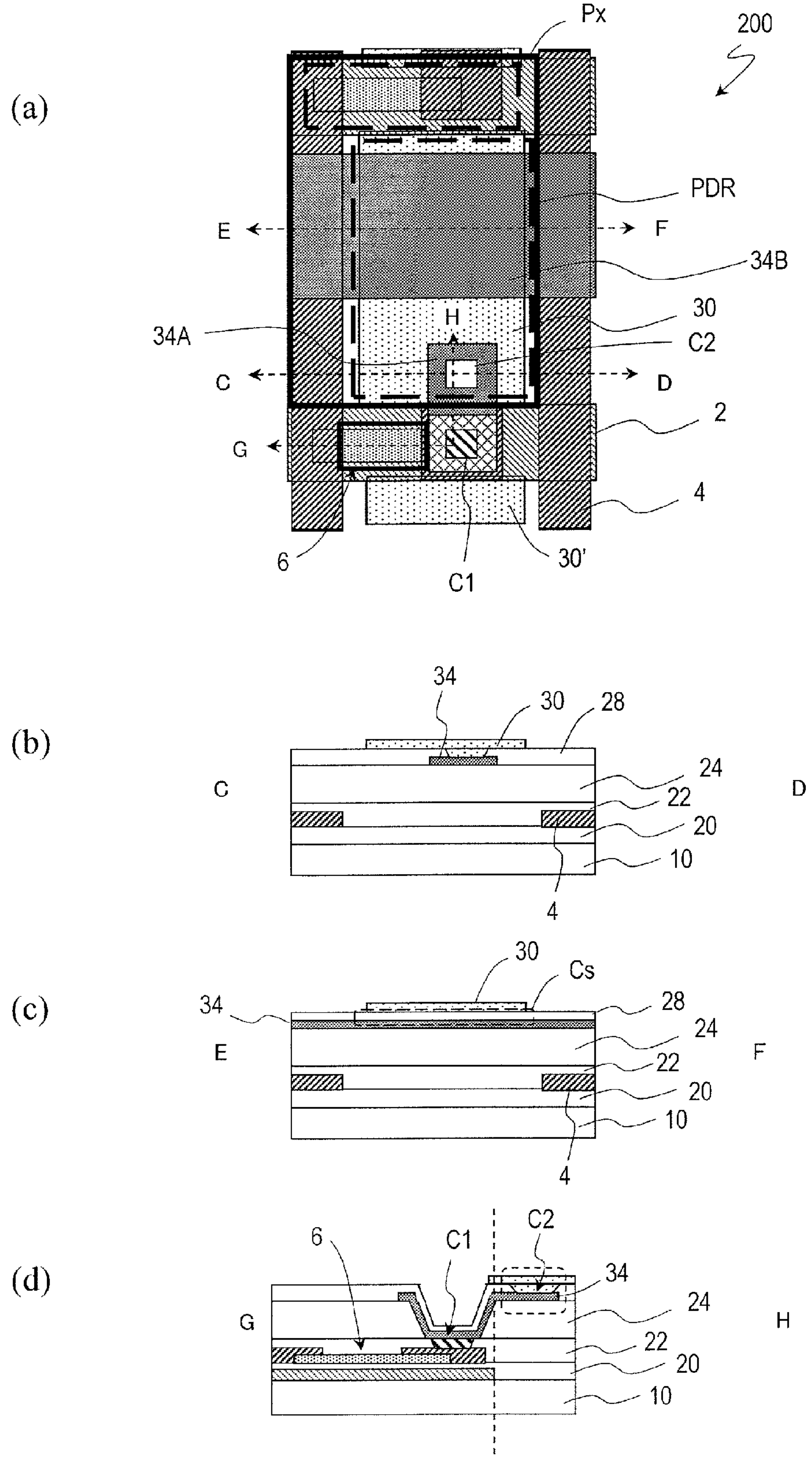
FIG. 11 Diagrams showing a region corresponding to generally one pixel of a TFT substrate of Embodiment 2 of the present invention. (a) is a plan view showing a region corresponding to generally one pixel. (b) to (d) are cross-sectional views taken along line C-D, line E-F and line G-H of (a).

FIGS. 11(*a*) to 11(*d*) are a plan view and cross-sectional views showing a configuration of a TFT substrate 200 of Embodiment 2. The TFT substrate 200 is suitably used in a liquid crystal display device which operates in the VA mode.

The TFT substrate 200 has the same configuration as that of the TFT substrate 100 of Embodiment 1 except that the common electrode 32 for generating a transverse electric field is not provided at a higher or lower level than the pixel electrode 30. In a liquid crystal display device which operates in the VA mode, a counter electrode (common electrode) is provided in a counter substrate which is arranged so as to oppose the TFT substrate 200 with a vertical alignment type liquid crystal layer interposed therebetween. In this configuration, the pixel electrode 30 and the counter electrode are used to apply a vertical electric field across the liquid crystal layer.

In the TFT substrate 200, the drain electrode 15 of the TFT 6 and the pixel electrode 30 are also connected with each other using the transparent connecting portion 34A of the intervening transparent electrically-conductive layer 34. In the transparent connecting portion 34A, the first connecting portion C1 that is connected with the drain electrode 15 is provided above the gate line 2, and the second connecting portion C2 that is connected with the pixel electrode 30 is provided in the pixel region. This arrangement enables to increase the effective pixel display region PDR in one pixel Px.

In the present embodiment also, the transparent electrically-conductive layer 34 includes a portion 34B, such that storage capacitance is formed between the portion 34B and the pixel electrode 30. In this case, it is not necessary to provide a light-blocking metal wire (storage capacitance line) in the same layer as the gate line 2. Thus, a high pixel aperture ratio can be realized.

The TFT substrate 200 typically includes a vertical alignment film (not shown) which is arranged so as to cover the pixel electrode 30. Using the thus-configured TFT substrate 200 enables to obtain a VA mode liquid crystal display device which operates in a normally-black mode.

Note that an alignment regulating structure, such as a rib, may be provided on the counter substrate or the pixel electrode 30, or a slit may be provided in the pixel electrode 30, such that a plurality of liquid crystal domains are formed in the presence of an applied voltage. This arrangement enables to obtain a liquid crystal display device of the MVA (Multi-domain Vertical Alignment) mode. Alternatively, a column-like protrusion may be provided on the counter substrate for making an alignment such that the liquid crystal alignment direction continuously varies in the presence of an applied voltage, whereby a liquid crystal display device of the CPA (Continuous Pinwheel Alignment) mode can be obtained.

Figure 12:
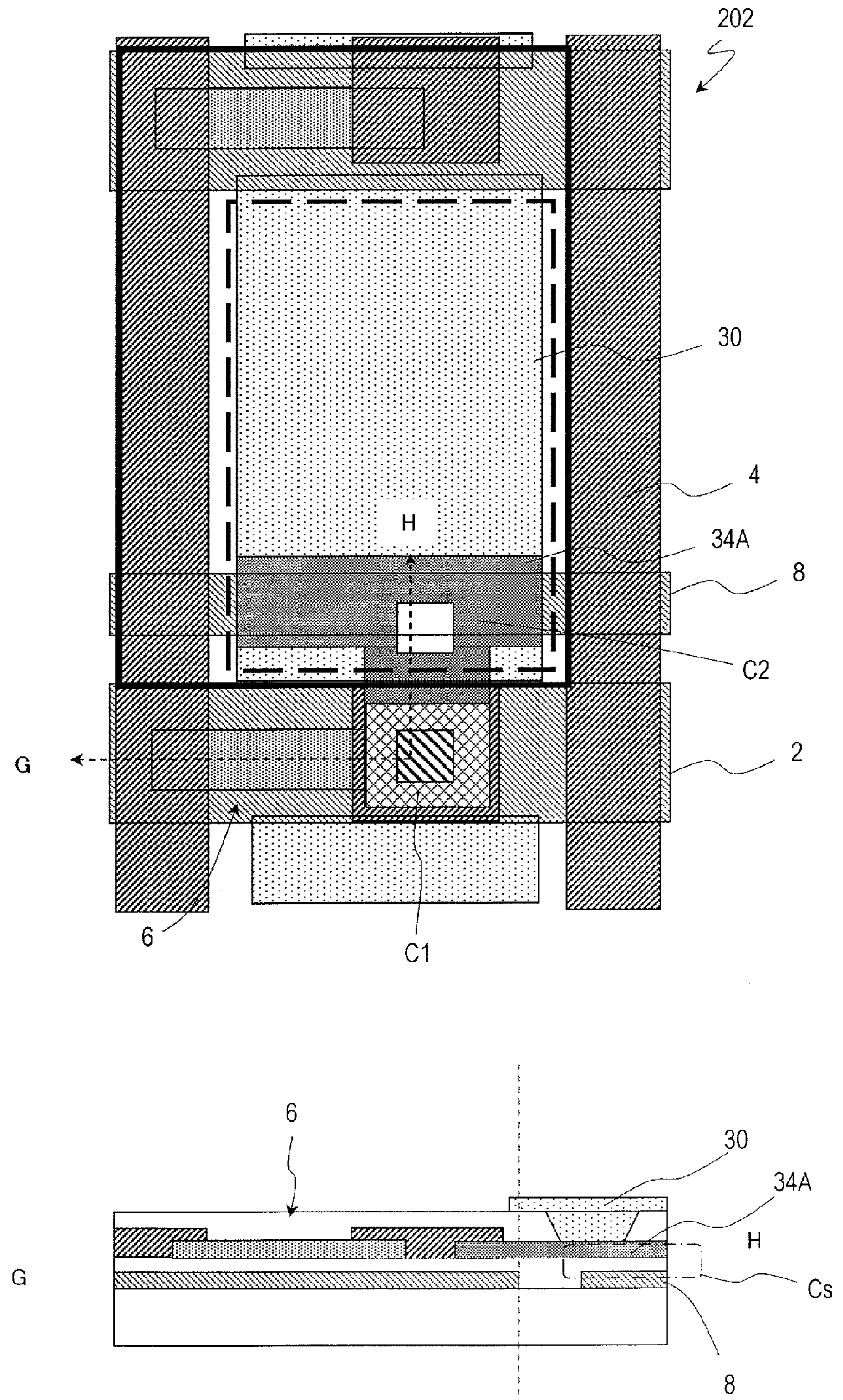
FIG. 12 Diagrams showing the configuration of a TFT substrate of a variation of Embodiment 2. (a) is a plan view showing a region corresponding to generally one pixel. (b) is a cross-sectional view taken along line G-H of (a).

FIGS. 12(*a*) and 12(*b*) show a TFT substrate 202 of a variation of Embodiment 2. In the TFT substrate 202, the storage capacitance line 8 is provided in the same layer as the gate line 2. The transparent connecting portion 34A has a portion extending along the storage capacitance line 8, so that storage capacitance Cs can be formed between the transparent connecting portion 34A and the storage capacitance line 8.

Note that, in the case where the storage capacitance line 8 is realized by a metal film such as Al, a region of the transparent connecting portion 34A in which the second connecting portion C2 is provided is not transparent when seen in a direction normal to the substrate. Note that, however, in this configuration also, the components from the transparent connecting portion 34A to the pixel electrode 30 are transparent, and a transparent contact portion is formed, such that a portion lying outside the storage capacitance line 8 can be utilized for display. Therefore, the aperture ratio can be improved.

Embodiment 3

Figure 13:
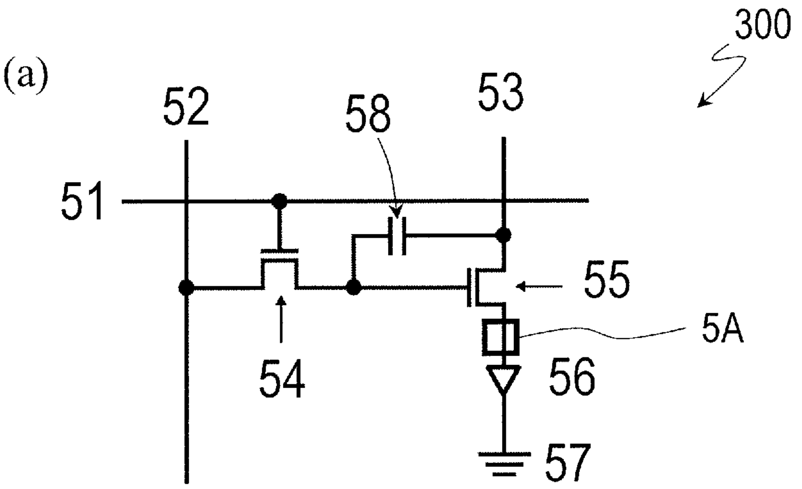
FIG. 13 Diagrams showing a region corresponding to generally one pixel of a TFT substrate of Embodiment 3 of the present invention. (a) is a circuit configuration diagram. (b) is a plan view.
Figure 13:
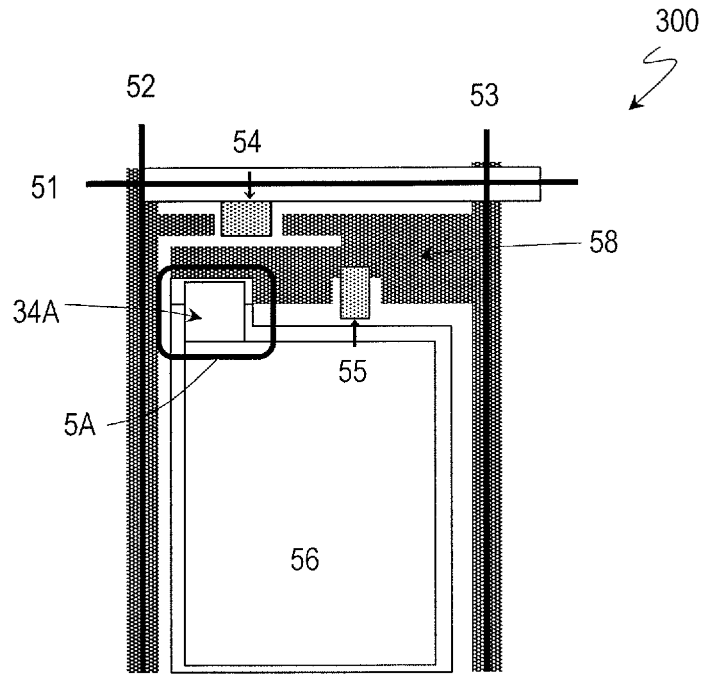

FIGS. 13(*a*) and 13(*b*) show a circuit configuration of one pixel and a schematic plan view of a TFT substrate 300 used in an organic EL display device.

The TFT substrate 300 of the present embodiment includes an organic EL element 56, which is a light-emitting element, a driver TFT 55 connected with the organic EL element 56, and a switching TFT 54 connected with the gate of the driver TFT 55.

The gate of the switching TFT 54 is connected with a scan line 51, and the source is connected with a data line 52. When the switching TFT 54 is set to the ON state using the scan line 51, the drain of the switching TFT 54 is supplied with a signal voltage (Vsig) from the data line 52.

The drain of the switching TFT 54 is connected with the gate of the driver TFT 55. The source of the driver TFT 55 is connected with a source line 53. When the signal voltage (Vsig) is applied to the gate of the driver TFT 55 using the switching TFT 54, an electric current flows from the source line 53 to the organic EL element 56 via the driver TFT 55. Note that the cathode 57 of the organic EL element 56 is connected to the ground. In such a configuration, the organic EL element 56 can emit light at a desired intensity.

Between the drain of the switching TFT 54 and the source of the driver TFT 55, a storage capacitance 58 is provided so as to overlap via a dielectric layer.

When the switching TFT 54 is in the ON state, the charge is stored in the storage capacitance 58. On the other hand, when the switching TFT 54 is in the OFF state, the gate voltage of the driver 55 is kept at the signal voltage Vsig because the storage capacitance 58 is connected as described above. Therefore, even when the switching TFT 54 is in the OFF state, emission of the organic EL element is continued.

Here, as shown in FIGS. 13(*a*) and 13(*b*), the connection of the drain of the driver TFT 55 and the organic EL element 56 is realized using the transparent connecting portion 34A included in the transparent electrically-conductive layer in the same way as in Embodiment 1, so that the transparent contact portion can be provided in the display region. This arrangement enables to further increase the emission region of the organic EL element 56.

Embodiment 4

Figure 14:
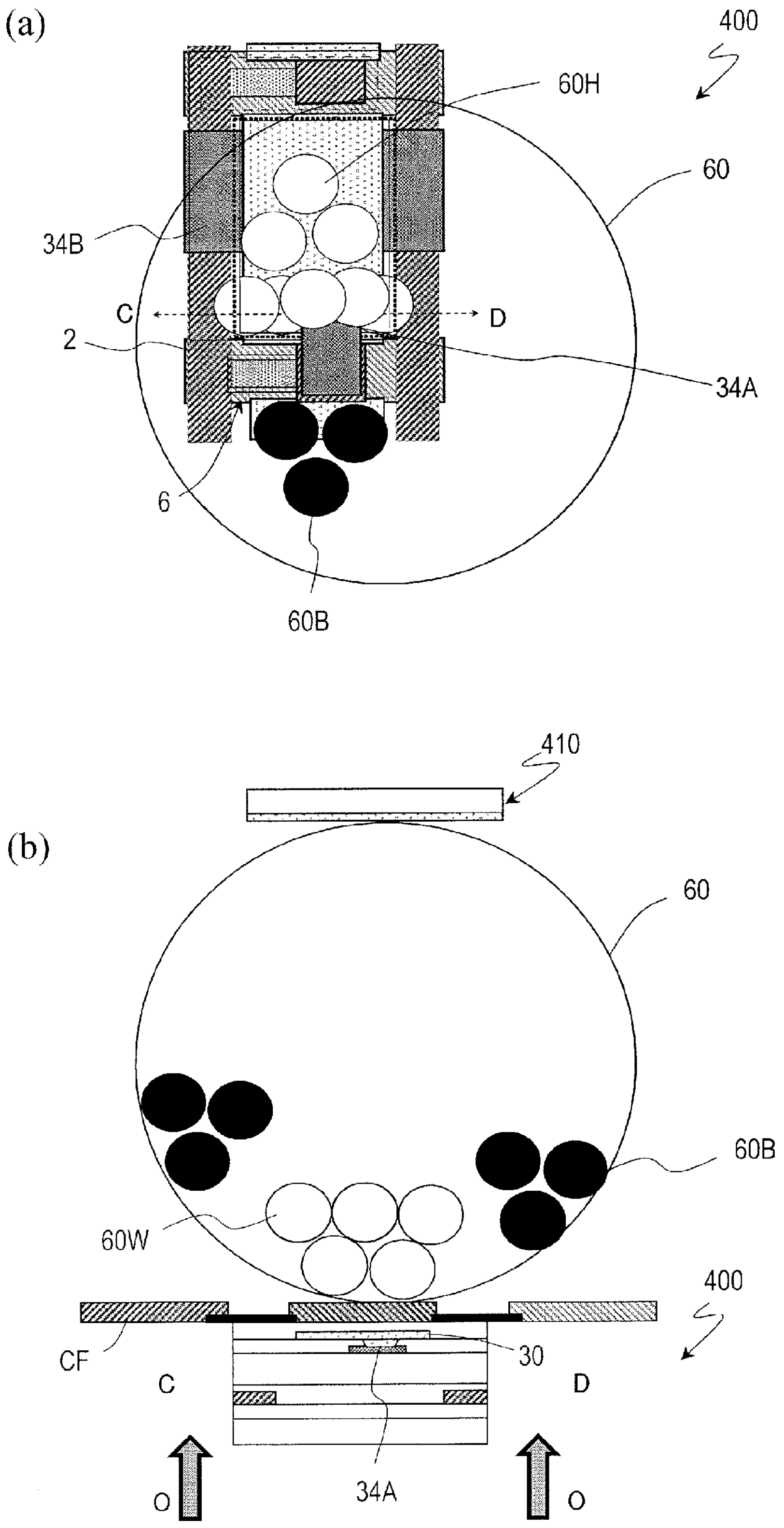
FIG. 14 Diagrams showing a region corresponding to generally one pixel of a TFT substrate of Embodiment 4 of the present invention. (a) is a plan view. (b) is a cross-sectional view taken along line C-D of (a).

FIGS. 14(*a*) and 14(*b*) show a TFT substrate 400 used in electronic paper which employs an electrophoretic system.

The electronic paper typically includes the TFT substrate 400, a counter substrate 410 which is arranged so as to oppose the TFT substrate 400, and a microcapsule layer which is held between these substrates.

The microcapsule layer includes a large number of microcapsules 60. Each microcapsule 60 is made of a transparent resin which has a diameter of several tens to several hundreds of micrometers. The microcapsules 60 contain positively-charged white particles 60W and negatively-charged black particles 60B which are dispersed in a transparent dispersion medium. Display can be performed by applying a positive or negative voltage across the microcapsule layer to cause electrophoresis of the white particles 60W and the black particles 60B in the microcapsules.

The electronic paper can be manufactured by, for example, providing the microcapsule layer on the counter substrate 410 by coating and combining the resultant structure with the TFT substrate 400. Color display can be realized by providing a color filter CF in the TFT substrate 400 or the counter substrate 410. Note that, when the color filter CF is not provided, the light utilization efficiency improves as compared with the color display, although the display is monochromatic.

The TFT substrate 400 and the counter substrate 410 may be formed using plastic substrates. In this case, it is possible to manufacture flexible electronic paper having a thickness of about 0.5 mm.

In the present embodiment, the rear surface side of the TFT substrate 400 corresponds to the viewing direction of the viewer (the direction represented by arrows O in FIG. 14(*b*)). In this configuration, the pixel electrode 30 provided in the TFT substrate 400 is a transparent electrode. The electrode provided in the counter substrate 410 is, typically, a reflecting electrode which is made of Al or a transparent electrode which is made of ITO or IZO. The channel portion of the TFT is desirably covered with a light-blocking film, or the like, in order to prevent occurrence of an operation error due to optical off-leak which is attributed to incoming of external light or reflected light.

Here, also in the TFT substrate 400, the TFT 6 is provided above the gate line 2, and the transparent contact portion is provided in the pixel region by utilizing the transparent connecting portion 34A included in the transparent electrically-conductive layer 34. This arrangement enables to enlarge a region of the pixel through which light (external light or the like) passes. Thus, brighter display can be achieved.

The storage capacitance forming portion 34B included in the transparent electrically-conductive layer 34 is arranged so as to oppose the pixel electrode, whereby occurrence of flicker is suppressed.

Although the embodiments of the present invention have been described hereinabove, various modifications are possible as a matter of course. For example, a semiconductor layer which forms the channel region of the TFT may be realized by an a-Si layer, a low-temperature polysilicon layer, or a CG-Si (Continuous Grain Silicon) layer, rather than an oxide semiconductor layer.

Note that, however, the oxide semiconductor layer has high mobility and produces a small off-leak current, and therefore, the size can be reduced, and it is not necessary to form a double-gate type TFT. Thus, using this layer is advantageous for improvement of the aperture ratio.

Note that the TFT 6 is preferably a bottom-gate type TFT. In the case of a bottom-gate type TFT, the source, channel and drain portions of the semiconductor layer are provided above the gate line 2, and the source line 4 and the drain electrode 15 can be provided in upper layers. This enables contact of the drain electrode 15 with the transparent connecting portion 34A above the gate line 2. As a result, the size of the TFT 6 can be reduced, and it is advantageous for improvement of the aperture ratio.

As previously described, a TFT substrate of an embodiment of the present invention is applicable not only to liquid crystal display devices but also to display devices of OLED, electrophoresis (electrowetting), flake display, etc.

INDUSTRIAL APPLICABILITY

A TFT substrate of an embodiment of the present invention is suitably used in display devices, such as liquid crystal display devices, and can realize a higher aperture ratio.

REFERENCE SIGNS LIST

2 gate line
4 source line
6 oxide semiconductor TFT
10 transparent substrate
12 gate electrode
14 source electrode
15 drain electrode
15' drain connecting portion
16 oxide semiconductor layer
20 gate insulating layer
21 etching stopper layer
22 passivation layer
23 first insulating layer
24 flattening layer
26 third insulating layer
28 second insulating layer (transparent insulating layer)
30 pixel electrode
32 common electrode
34 transparent electrically-conductive layer
34A transparent connecting portion
34B storage capacitance forming portion
C1 first connecting portion
C2 second connecting portion
CH contact hole

The invention claimed is:

1. A TFT substrate, comprising:

a substrate;

a gate line and a source line which are provided on the substrate;

a TFT including a gate electrode connected with the gate line, a source electrode connected with the source line, a drain electrode, and a semiconductor layer;

a transparent pixel electrode electrically coupled with the drain electrode of the TFT;

a transparent electrically-conductive layer including a transparent connecting portion connected with the drain electrode of the TFT and the transparent pixel electrode, the transparent connecting portion including a first connecting portion which is a portion connected with the drain electrode and a second connecting portion which is provided at a different position from the first connecting portion and which is a portion connected with the transparent pixel electrode; and a transparent insulating layer provided between the transparent pixel electrode and the transparent electrically-conductive layer, the transparent insulating layer having an opening at a position corresponding to the second connecting portion, wherein at least part of the second connecting portion and at least part of the opening are present in a region enclosed by the gate line and the source line, and in the second connecting portion, at least a portion ranging from the transparent connecting portion to the transparent pixel electrode is configured to allow transmission of light.

2. The TFT substrate of claim 1, wherein the transparent connecting portion is arranged in the form of an island, the first connecting portion is provided above the gate line, and at least part of the second connecting portion is provided at a position which does not overlap the gate line in the vicinity of the first connecting portion.

3. The TFT substrate of claim 1, wherein the transparent pixel electrode and the first connecting portion do not at least partially overlap each other when seen in a direction normal to the substrate.

4. The TFT substrate of claim 3, wherein the transparent pixel electrode has a rectangular planar shape, and one of four sides of the transparent pixel electrode which is near to the TFT is positioned on a pixel region side relative to the gate line.

5. The TFT substrate of claim 1, further comprising a gate insulating layer provided on the gate electrode, wherein the source electrode, the drain electrode, and the semiconductor layer are provided on the gate insulating layer.

6. The TFT substrate of claim 1, further comprising a flattening layer which is arranged so as to cover the TFT, wherein the first connecting portion of the transparent connecting portion is provided in an opening provided in the flattening layer, and the second connecting portion of the transparent connecting portion is provided on the flattening layer.

7. The TFT substrate of claim 6, wherein the flattening layer has a thickness of not less than 1 μm and not more than 3μm, and the transparent insulating layer has a thickness of not less than 10 nm and not more than 500 nm.

8. The TFT substrate of claim 6, wherein the flattening layer is made of a photosensitive organic insulative material, and the transparent insulating layer is made of an inorganic insulative material.

9. The TFT substrate of claim 6, wherein a size of an opening provided in the flattening layer is not less than 3 μm and not more than 10 μm, a size of an opening provided in the insulating layer is not less than 2 μm and not more than 9 μm, and the former is greater than the latter.

10. The TFT substrate of claim 1, wherein the transparent electrically-conductive layer further includes a storage capacitance forming portion which is insulated from the transparent connecting portion, and the storage capacitance forming portion forms a storage capacitance between the storage capacitance forming portion and the transparent pixel electrode via the transparent insulating layer.

11. The TFT substrate of claim 1, further comprising:

a common electrode which is arranged so as to oppose the transparent pixel electrode; and an insulating layer provided between the common electrode and the transparent pixel electrode, wherein the common electrode is electrically insulated from the transparent pixel electrode and the drain electrode, at least one of the transparent pixel electrode and the common electrode has a plurality of slits or a plurality of elongated electrode portions, and the common electrode and the transparent pixel electrode are configured such that an oblique electric field is produced between the common electrode and the transparent pixel electrode.

12. The TFT substrate of claim 11, wherein the common electrode has a plurality of slits or a plurality of elongated electrode portions, and the transparent pixel electrode does not have a plurality of slits or a plurality of elongated electrode portions, the common electrode, the transparent pixel electrode, the transparent insulating layer, and the transparent electrically-conductive layer are arranged in this order from a top layer.

13. The TFT substrate of claim 1, wherein the semiconductor layer is an oxide semiconductor layer.

* * * * *